(12) United States Patent
Duggal

(10) Patent No.: US 11,362,616 B2
(45) Date of Patent: Jun. 14, 2022

(54) MULTI-FUNCTIONAL SOLAR POWERED BARRIER WALLS AND THEIR FINANCING METHODS

(71) Applicant: Vijay Duggal, Elmhurst, NY (US)

(72) Inventor: Vijay Duggal, Elmhurst, NY (US)

( * ) Notice: Subject to any disclaimer, the term of this patent is extended or adjusted under 35 U.S.C. 154(b) by 0 days.

(21) Appl. No.: 15/912,558

(22) Filed: Mar. 5, 2018

(65) Prior Publication Data
US 2018/0254736 A1   Sep. 6, 2018

Related U.S. Application Data

(60) Provisional application No. 62/467,809, filed on Mar. 6, 2017.

(51) Int. Cl.
| | |
|---|---|
| H02S 20/10 | (2014.01) |
| F03D 9/00 | (2016.01) |
| H01L 31/042 | (2014.01) |
| F03D 9/43 | (2016.01) |
| F24S 25/11 | (2018.01) |
| H02S 10/12 | (2014.01) |
| F24S 25/13 | (2018.01) |
| H02S 20/21 | (2014.01) |
| F24S 20/00 | (2018.01) |

(52) U.S. Cl.
CPC ............. *H02S 20/10* (2014.12); *F03D 9/007* (2013.01); *F03D 9/43* (2016.05); *F24S 25/11* (2018.05); *F24S 25/13* (2018.05); *H01L 31/042* (2013.01); *H02S 10/12* (2014.12); *H02S 20/21* (2014.12); *F05B 2240/9113* (2013.01); *F24S 2020/14* (2018.05); *Y02B 10/30* (2013.01); *Y02E 10/72* (2013.01); *Y02E 10/728* (2013.01)

(58) Field of Classification Search
CPC . H02S 20/10; H02S 20/21; F24S 25/11; F24S 25/13
See application file for complete search history.

(56) References Cited

U.S. PATENT DOCUMENTS

| | | | | |
|---|---|---|---|---|
| 6,177,131 | B1 * | 1/2001 | Glaubitt | F24S 70/30 |
| | | | | 427/162 |
| 2003/0095834 | A1 * | 5/2003 | Witcher | E01F 15/145 |
| | | | | 404/6 |
| 2004/0244996 | A1 * | 12/2004 | Kravkov | A62C 3/0292 |
| | | | | 169/5 |
| 2008/0149403 | A1 * | 6/2008 | Fein | B60L 8/006 |
| | | | | 180/2.2 |
| 2009/0001335 | A1 * | 1/2009 | Wilson | E01F 13/12 |
| | | | | 256/13.1 |
| 2010/0077679 | A1 * | 4/2010 | Sagayama | F24S 25/617 |
| | | | | 52/173.3 |
| 2010/0200041 | A1 * | 8/2010 | Dearborn | B60L 8/003 |
| | | | | 136/244 |

(Continued)

*Primary Examiner* — Daniel P Malley, Jr.

(57) ABSTRACT

Multi-functional barrier walls equipped with solar panels, Structural Solar Panels (SSPs) and/or wind turbines along liner boundaries, farmlands, fire zones, highways, railroads, liner terrains or linearly configured spaces to produce electricity from solar and wind energy. The barrier walls may be used as boundary walls, security barriers, sound attenuating barriers, fire barriers, wind barriers or dust barriers. A method of financing the said barrier walls by the electricity produced by the said solar panels, said Structural Solar Panels (SSPs) and/or wind turbines.

6 Claims, 25 Drawing Sheets

(56) References Cited

U.S. PATENT DOCUMENTS

| | | | | |
|---|---|---|---|---|
| 2011/0023867 A1* | 2/2011 | Muchow | ............... | F24S 25/33 |
| | | | | 126/623 |
| 2011/0047931 A1* | 3/2011 | Wallgren | ............... | H02S 20/24 |
| | | | | 52/745.19 |
| 2011/0134623 A1* | 6/2011 | Sherman | ............... | G02B 6/005 |
| | | | | 362/19 |
| 2011/0279937 A1* | 11/2011 | Signorelli | ............ | H03K 17/063 |
| | | | | 361/79 |
| 2013/0342155 A1* | 12/2013 | Neel | ............... | H02S 40/38 |
| | | | | 320/101 |
| 2014/0238468 A1* | 8/2014 | Brounne | ............... | H01L 31/048 |
| | | | | 136/251 |
| 2014/0246903 A1* | 9/2014 | Romeo | ............... | F24S 30/425 |
| | | | | 307/11 |
| 2016/0254775 A1* | 9/2016 | Dalland | ............... | H02S 30/10 |
| | | | | 136/251 |

\* cited by examiner

MULTI-FUNCTIONAL SOLAR POWERED BARRIER WALLS AND THEIR FINANCING METHODS

CROSS-REFERENCE TO RELATED APPLICATIONS

The present application claims benefit of provisional utility application 62/467,809; the entire contents of the provisional application are incorporated into the present application by reference.

BACKGROUND OF THE INVENTION

The present invention relates to multi-functional barrier walls equipped with solar panels, Structural Solar Panels (SSPs) and/or wind turbines that may also act as boundary walls, security barriers, sound attenuating barriers, fire barriers, wind barriers or dust barriers. It particularly relates to creating a revenue generating barrier wall by equipping the barrier wall with solar panels, Structural Solar Panels (SSPs) and/or wind turbines to produce electricity, and using the revenue from the said electricity to substantially pay for the said barrier wall.

DESCRIPTION OF RELATED ART

No prior art seems to claim a method for making a boundary wall or a barrier wall to pay for itself as intended by the present invention. Different kinds of boundary wall and fence designs are available such as disclosed in patents U.S. Pat. No. 9,453, 356 U.S. Pat. No. 7,880,630, U.S. Pat. No. 7,419,140 and U.S. Pat. No. 4,829,286. They are suitable for their intended purpose for securing a boundary. However building such barrier walls along large boundaries, such as for borders between countries can be cost prohibitive. The following prior art examples are provided as a reference to avoid overlaps because the present invention uses solar and wind energy as a means to generate electricity to substantially pay for the barrier wall along linear boundaries, highways, railroads and other linearly configured spaces.

US patent 2008/0150295 by Gene Fein and Edward Merritt discloses an invention in which solar generating devices such as solar panels and solar films are used along highways to generate electricity. The specification section of this prior art (pages 8-9 and FIGS. 8, 9, 11) calls for several methods and devices to gather solar energy but they are inefficient to produce commercial scale electricity. For example the specification section [0083] describes the solar devices as: "Panels or backed films may be mounted to median guardrails (Item 51) or roadside guardrails (Item 52)". For commercial scale electric output large arrays of solar panels would be required which would be quite heavy, and subjected to severe wind loads and traffic vibrations. Guardrails are not meant to support such loads, and they are themselves subject to damage by vehicular impact. This prior art specification also calls for: "Displays of the panels or films may include custom formation around objects, pyramid configurations (Item 54), facing flat toward the sky (Item 55)". To generate commercial scale electricity using solar film requires a very large area. To wrap solar film around pyramids would require very large pyramids located in a road median as shown. It would require very wide medians which would be cost prohibitive due to land costs. The specification also calls for the solar panels or solar film "facing flat toward the sky". This would significantly curtail electricity production because for optimal solar electricity production, the solar panels must be installed at an inclination matching the latitude of the location. For example for many regions in the United States, the tile angle of the panels should be around 32-42 degrees from the horizontal plane, and the panels should face substantially south. Facing the panels "flat toward the sky" would not only curtail electricity production but would also collect highway dust to severely impair the installation in a very short period. The specification also calls for the use of "electronic tilts (Item 57) built to maximize the solar gathering materials access to direct contact with the sun rays." Such solar tracking devices are quite expensive to be used along highways. The specification section [0086] of this prior art also describes the solar installation as: "solar panels (Item 100) deployed on the roadside lanes in a continuous manner". Deploying the solar panels "on the roadside lanes" would compromise safety as these lanes are reserved for emergencies. This specification section also calls for: "solar films with backing formed over guardrails (Item 106) and spray on solar material." Guardrails provide very little surface area to generate electricity at a scale that could be considered usable for commercial use. The specification also calls for: "solar sprayed on power cells, "solar paint" sprayed as roadway markers (Item 105)." Roadway markers are subjected to gathering dust and the solar paint is likely to be worn out by vehicular traffic. Furthermore to electrically connect these solar markers along highways would require continuous waterproof wire trenches along the highways which would be cost prohibitive. The small areas of the markers would provide very little electric output to justify the cost. FIG. 12 of this prior art shows a plan of how various components of the invention such as solar panels, highways, service area, entrance and exit are arranged to distribute electricity from the solar panels. As shown, the service area to utilize the electricity from the solar panels is located right in the middle of highways which would impede traffic, and is unpractical. Another patent U.S. Pat. No. 7,501,713 by the same inventors suffers from similar setbacks. These patents are not intended for any sound attenuation benefits. None of the methods described in this prior art can be used to provide any sound attenuation benefits to protect from the highway noise.

Patent WO2011151677 by K. C. Somaratna relies on "a battery charging system for vehicles comprising solar power conversion mechanisms installed along roadways." Solar energy is unpredictable due to weather conditions; this solution may suffer due to total reliance on solar power and batteries without any backup of utility grid. International Searching Authority's written opinion has found this invention lacking innovative step.

Patent EP2363531 by Alois Apfelböck proposes a solar panel equipped soundproof wall and claims the invention as follows: "Equipped with solar panels soundproof wall which extends laterally along a road or rail line, the solar panels are functional part of the noise barrier . . . ". Soundproof walls are used for very exclusive situations such as theaters, auditoriums, recording studios and operation theaters as they are expensive to construct. Soundproof walls in an outdoor environment serve no purpose as ambient noise can be transmitted over the barrier. For roadside sound barriers only certain sound attenuation measures are sufficient to retard the noise at a predetermined level. To make the wall "soundproof" as claimed would be unnecessary and cost prohibitive. To achieve soundproofing this prior art uses a number of layers to construct the wall as described in the abstract: "The barrier (5) has thermal and/or photovoltaic solar modules (4) mounted on a common outer upper noise barrier surface (9) that is turned towards sun, where the barrier is inclined with a constant inclination angle opposite to horizontals. The noise barrier surface and an inner lower noise barrier surface (10) are designed in a sound-reflecting manner, where the inclination angle ranges between 30 and 70 degrees. A water and/or humidity-impermeable protection layer is arranged on an upper side that is turned towards the solar modules, where the barrier is made from wood or planking board." As described the soundproof barrier is made up of several layers: An outer noise barrier, an inner noise barrier, water and/or humidity-impermeable layer and a support system made of wood or planking board. This is quite an expensive assembly to construct, yet it suffers from several setbacks: For commercial scale solar installation a large size barrier would be required to accommodate thousands of solar panels. "Wood and planking board" as specified would not provide the structural support needed. The barrier must be capable of sustaining wind loads, traffic vibrations, and needs to be protected from damage from traffic impacts. Therefore a stronger material such as concrete or steel would be preferred. The specification calls the barrier to be "water and/or humidity-impermeable". To make the solar barrier water or humidity impermeable is not necessary as the barrier is not meant to protect a property underneath. This would add unnecessary cost to the installation. The specification describes the support for the barrier as: "A stand construction is selected with mounted on ground anchors support posts. The foundations may have a preferable height of 0.9 m". For commercial applications such a foundation would fail as the barrier loaded with solar panel weight must also resist heavy wind loads and traffic vibrations. The specification calls for the barrier to contain several layers as illustrated in FIG. 3 of the prior art: The solar panels are mounted on a trapezoid sheet 21 which is mounted on noise barrier 5. The noise barrier is supported by T beams which are further supported by a continuous structural substrate 6b. Building a soundproof wall using all these layers would be cost prohibitive and is not necessary to achieve the desired objective. The indicated construction assembly would require in situ construction which is labor intensive and expensive. The specification calls for the weight for this entire wall assembly to be 12.5 kg/Sq. Meter. The average weight of solar panel is about 11 kg/Sq.M. This leaves only about 1.5 kg/Sq. M. for all the structural components of the wall as specified. It is not structurally feasible to support 11 kg/Sq.M weight along a highway which is subjected to wind loads and traffic vibrations using such a lightweight support structure made of wood and planking boards with foundations only 0.9 m deep. For long term durability of the structure, durable and stronger materials would be preferred so that the installation can be guaranteed for 30 to 40 years to recover the cost of solar panel installation.

Patent US 20100200041 by David Dayton Dearborn proposes putting solar panels on a canopy using a support column in between two train tracks: "A method of generating high potential electrical energy for electric powered rail vehicle traction power comprising a plurality of solar PV (4) covered (2) roof-like structures (3) said herein canopy modules (1-1), in alignment with and above a tie-and-rail vehicle guide track system (15) or right of way." This seems a practical approach to power electric trains; however it may not be suitable for many geographic locations because the solar panels should be installed at an angle directly facing the sun. For example for most of the United States a tilt angle of the panels facing south should be between 32-40 degrees from the horizontal. Hence the canopy as shown would not work. The cantilevered canopy as shown also poses structural span limitations. Hence only limited solar capacity may be installed. This patent is not intended for any sound attenuation benefits. Note of the aforementioned prior arts claim a barrier wall that can be made to substantially pay for by itself as intended by the present invention.

BRIEF SUMMARY OF THE INVENTION

The present invention discloses multi-functional solar panels or Structural Solar Panels (SSPs) equipped barrier walls that can be used as boundary walls, security barriers, sound attenuating barriers, fire barriers, wind barriers or dust barriers. The objective of the present invention is to equip a barrier wall with solar panels or Structural Solar Panels (SSPs) to produce clean electricity that can be used to substantially pay for the barrier wall. In one embodiment of the invention the barrier wall is also be equipped with micro wind turbines to supplement electricity output from solar panels or Structural Solar Panels (SSPs). The wind turbines may be installed independent of the barrier wall in rows along the said barrier wall.

Boundary walls are often made of brick and mortar, concrete panels, corrugated sheets, barb wires, normandy or anti-ram kind of fencing. All such configurations cost money. Disagreements are known to exist between countries and property owners about how to pay for a boundary wall or a border wall. How to reduce carbon dioxide emissions is another issue that continues to divide nations and political interest groups.

The present invention brings forth a novel idea to reduce carbon emissions by using barrier walls as means to produce clean energy. The barrier walls may also function as boundary walls, sound attenuation barriers or fire barriers while generating clean electricity from the solar energy and wind energy. Solar panels or Structural Solar Panels (SSPs) are mounted over the barrier wall which produces electricity from solar energy. The projected revenue from the electricity is used to secure loans, loan guarantees and credit lines for the barrier wall construction. The initial capital for the barrier wall can also be raised by private investments, public investments, Private Activity Bonds (PABs), government investments and government spending. The private and public investments can be backed by government tax incentives and/or loan guarantees. Upon completion of the solar barrier wall the revenue from the electricity is used to pay back the loans. The objective of the present invention is to produce clean electricity from solar and wind energy utilizing linear boundaries, sides of the roads or railroads, edge or farmlands, rivers, foothills, or other linearly configured spaces. The barrier walls erected along such terrains can produce huge amounts of clean electricity to reduce carbon dioxide emissions, and can also act as boundary walls, sound attenuating barriers, fire barriers or dust barriers. For example a solar barrier wall can be constructed along highways to produce electricity from solar energy and also act as a sound attenuating barrier. A solar barrier wall can be erected along fire prone zones to protect against industrial fires or wild fires. A solar barrier wall can be erected along farmlands, and the electricity produced by the barrier can be used for irrigation of the farmland. Similarly solar barriers can be erected along other linear terrains. The cost of building such barriers can be subsidized by the revenue from the electricity produced by the barrier. For the purpose of this application the terms such as boundary wall, border wall, solar barrier, barrier wall or solar wall are generally interchangeable. In one embodiment of the present invention the barrier wall is also equipped with wind turbines to supplement electricity output from solar panels. In one embodiment of the present invention the barrier wall is also equipped with advertising panels for additional revenue to pay for the wall.

In one embodiment of the invention the barrier wall is comprised of an inclined structural frame assembly 5 (FIGS. 1 and 2) in which solar panels 3 or Structural Solar Panels (SSPs) 8 are mounted over wedges 6 for maximum solar exposure. In another embodiment of the invention, the barrier wall is comprised of a canopy like structure (FIGS. 4 and 5) in which Structural Solar Panels (SSPs) 45 are mounted over canopy frame 44. In other embodiments of the invention the barrier walls are in the form of inclined cantilever structures (FIGS. 6, 7, 9a and 9b). The solar panels or Structural Solar Panels (SSPs) are mounted over the inclined cantilevered portion of the structure. The inclination angle and orientation of the inclined structural frames, canopies and/or cantilevers is predetermined for maximum solar exposure. The solar panels or Structural Solar Panels (SSPs) form the active part of the barrier wall to generate electricity from solar energy. In one embodiment of the present invention the barrier wall is used as a security barrier comprising solar panels backed with rigid panels such as reinforced concrete. The security barrier can be equipped with lights and intrusion detection sensors powered by the electricity produced by the barrier wall and backed by electricity storage batteries and utility grid. In one embodiment of the invention the barrier wall is used as a sound attenuating barrier alongside highways; in this embodiment the solar panels are backed with sound attenuating materials. In one embodiment of the invention the barrier wall is used as a fire barrier to protect against industrial or wild fires. In this embodiment the solar panels are backed with fire resistant materials and the barrier wall is equipped with fire suppression measures such as fire hoses and water sprinklers. In one embodiment of the invention the barrier wall is used as boundary protection for farmlands; it uses electricity from the solar panels for irrigation of the farmlands. In one embodiment of the invention the barrier wall is used as a wind and/or dust barrier to protect against shifting sand dunes in a desert area. In one embodiment of the invention the barrier wall is also equipped with advertising panels for additional revenue.

Vijay Duggal, the author of the present application is a registered architect in the United States, licensed in the State of New York. Additional information about the designs disclosed in the present application can be obtained by contacting him by using the information provided at www.innotect.net/duggal. Twitter handle: @ArchitectDugg. All rights are reserved for the disclosures made in this application.

DETAILED DESCRIPTION OF THE INVENTION

The following are exemplary embodiments of the present invention. The terminology to describe various assemblies and components is generally used in a broader sense; variations in terminology may exist to denote like or similar components in different embodiments of the invention. For clarity, like elements in drawings are generally labeled only once. Alternative terms are used to broaden the understanding; overlaps in terminology may exist. For example the terms frames and framing members are interchangeable. The term solar panel(s) is used to indicate any devices capable of converting solar energy into electricity such as: photovoltaic cell, solar films, solar paint, thermal cells or receptors, crystalline silicon, monocrystalline, polycrystalline, thin film amorphous silicon (a-Si), cadmium telluride (CdTe), copper indium gallium selenide (CIS/CIGS), organic photovoltaic cells (OPC) or similar technologies capable of converting solar energy into electrical energy. The term Structural Solar Panel(s) (SSPs) refers to indicate novel solar panels that can also perform a structural function while using the above listed solar devices. The term 'solar panels' refers to conventional solar panels while Structural Solar Panels (SSPs) are novel as an embodiment of the present invention. Components that are insignificant to the core spirit of the invention are omitted to avoid clutter. Reasonable professional judgements can be made for errors and omissions by cross-referencing different embodiments of the present invention, drawings and claims in light of the spirit of the present invention. The terms such as boundary wall, border wall, barrier wall, inclined frame structure or solar wall are generally interchangeable for the purpose of this application. Some exemplary design configurations and financing methods that make it possible to create a border wall that pays for by itself are disclosed; other similar configurations that can be developed based on these disclosures are within the scope of the present invention.

Figure 1:
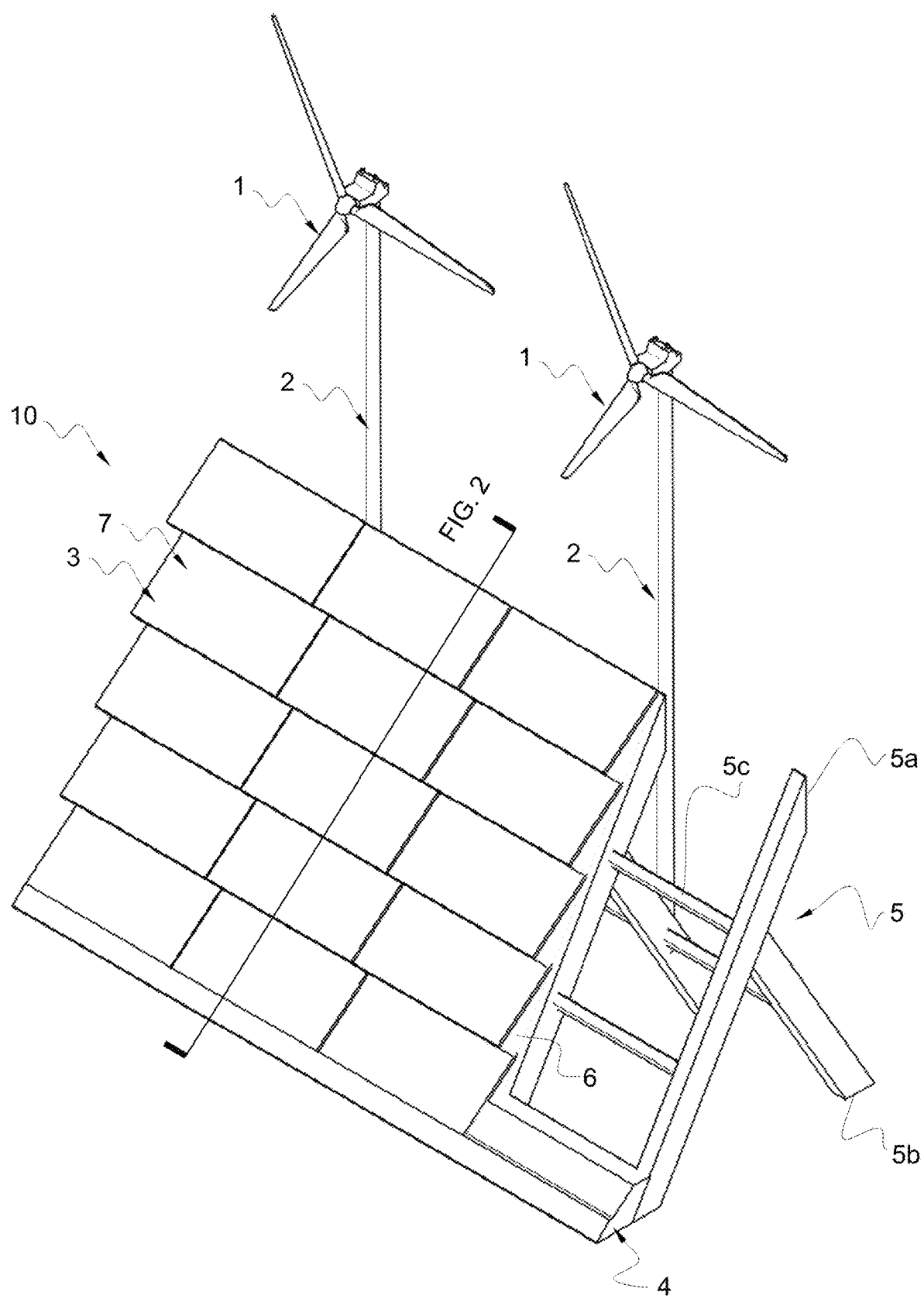
FIG. 1: 3D view of one embodiment of the invention
Figure 2A:
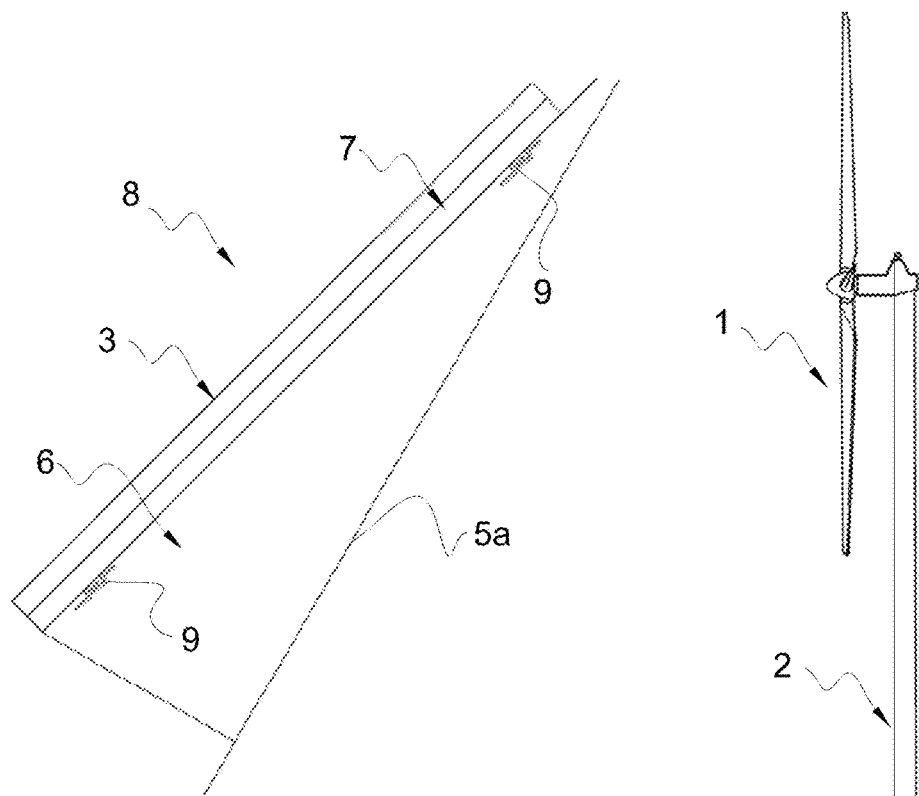
FIG. 2: Sectional view of the embodiment of the invention disclosed in FIG. 1
FIG. 2a: Detailed sectional view of FIG. 2
FIG. 3: 3D view of one embodiment of the invention
Figure 2:
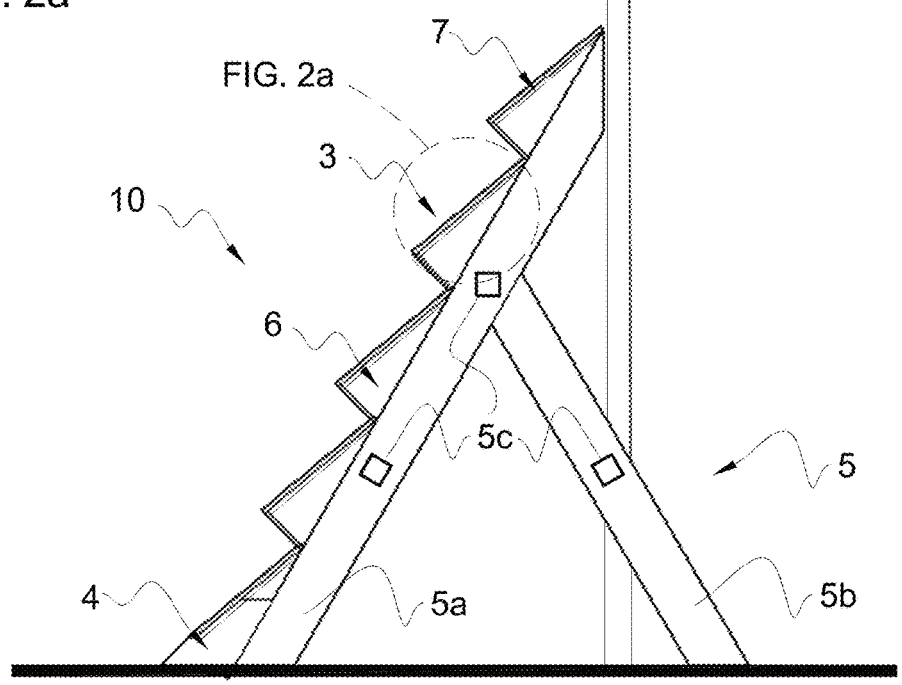
Figure 15:
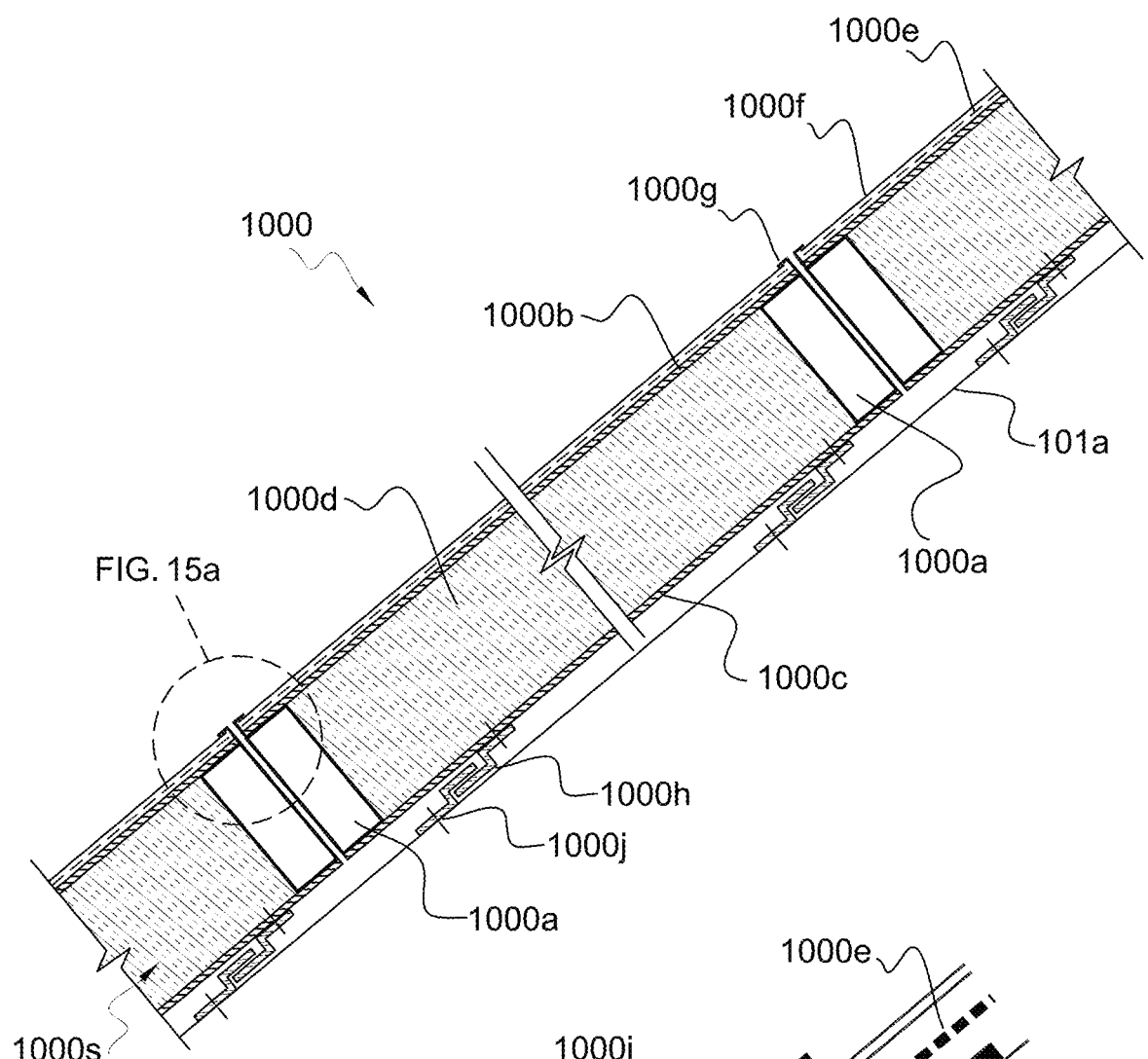
Figure 15A:
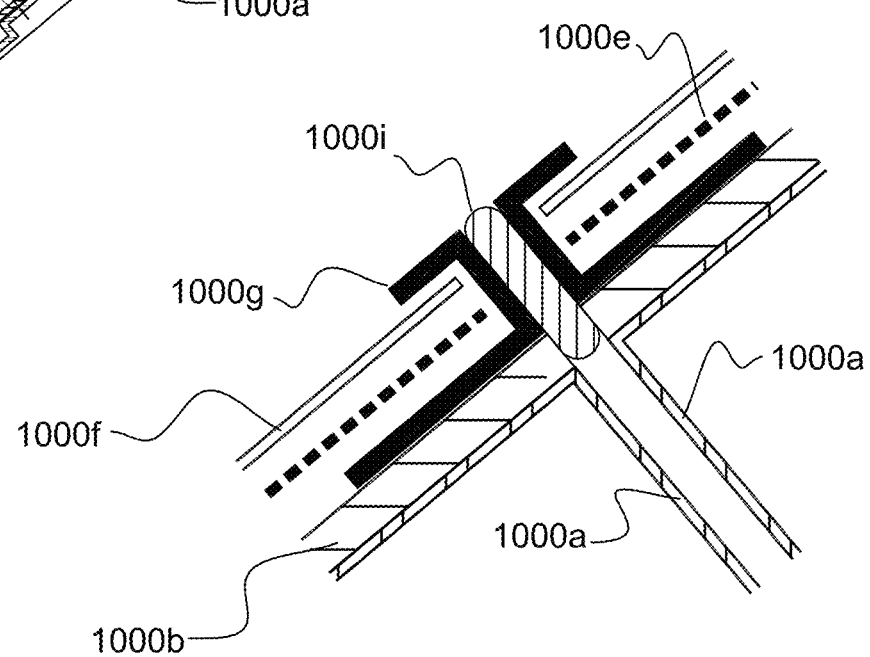

FIGS. 1, 2 and 2a disclose an embodiment of the invention in the form of barrier wall 10 comprising wind turbines 1, turbine posts 2, solar panels 3, vehicle impact barrier 4 and structural frame assembly 5. Wind turbines 1 can be supported by barrier wall 10 or they can be installed independent of the barrier wall in rows along the barrier wall. The direction of wind turbines 1 is predetermined based on the wind direction at a particular geographic location. Assembly 5 is comprised of plurality of inclined structural framing members 5a, which are supported by plurality of lateral bracing members 5b and cross bracing members 5c. Structural members 5a, 5b and 5c could be made of precast concrete, structural steel, or structural frames formed by joining plurality of rigid structural components together in a predetermined configuration. Solar panels 3 can be photovoltaic, solar film (or similar technology) supported over rigid panels 7. Rigid panels 7 are supported by framing members 5a by using structural wedges 6 to incline rigid panels 7 at a predetermined angle for maximum solar exposure. Rigid panels 7 can be precast concrete, fiber reinforced plastic or a sandwich assembly of composite materials. Solar panels 3 are mounted over rigid panels 7. In one embodiment of the invention solar panels 3 and rigid panels 7 are formed as a single manufactured unit referred to as Structural Solar Panel (SSP): assembly 8. Structural Solar Panels (SSPs) can be factory manufactured as modular panels that can be directly installed over wedges 6 using Z-clips 9 or other structural methods (FIG. 2a). FIGS. 15 and 15a disclose additional information on Structural Solar Panels (SSPs). SSPs offer a novel approach to streamline construction because besides being solar panels, they serve a structural function as well. Conventional solar panels do not provide any structural integrity; they need to be installed over a structural substrate using rails and runners. Structural Solar Panels (SSPs) 8 and 1000 (FIGS. 15 and 15a) can revolutionize the construction industry not just for the solar barrier walls, but for other applications as well such as residential and commercial construction.

Figure 3:
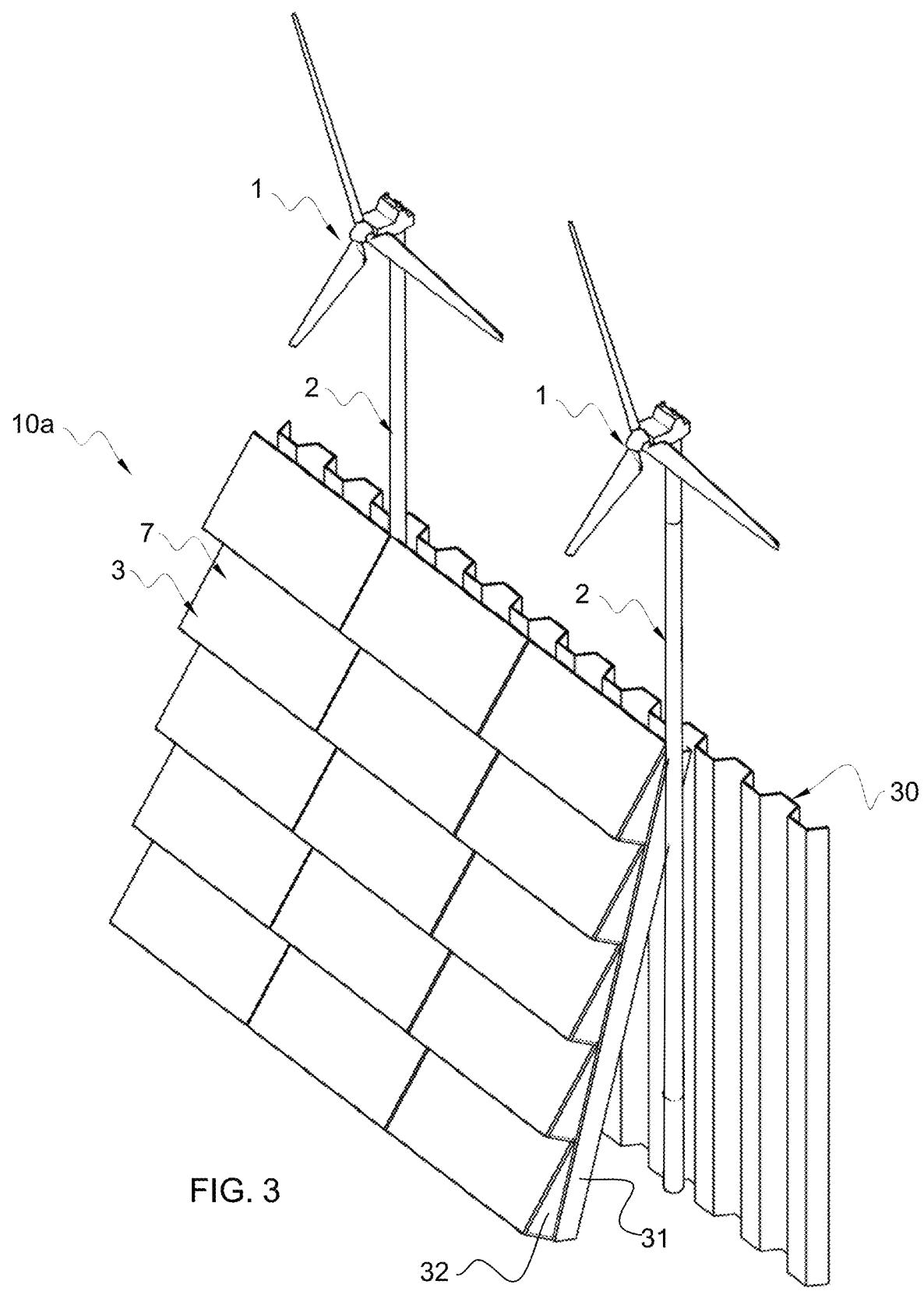

FIG. 3 discloses an embodiment of the present invention in the form of barrier wall 10a comprising wind turbines 1, turbine posts 2, solar panels 3, sheet piles 30 and inclined frames 31. Inclined frames 31 are supported by sheet piles 30. Solar panels 3 are inclined at a predetermined angle from inclined frames 31 using wedges 32 to gain maximum solar exposure. Solar panels 3 are supported over rigid panels 7 similar to as shown in FIGS. 1 and 2. Optionally Structural Solar Panels (SSPs) similar to 8 or 1000 can be installed directly over wedges 32.

Figure 4:
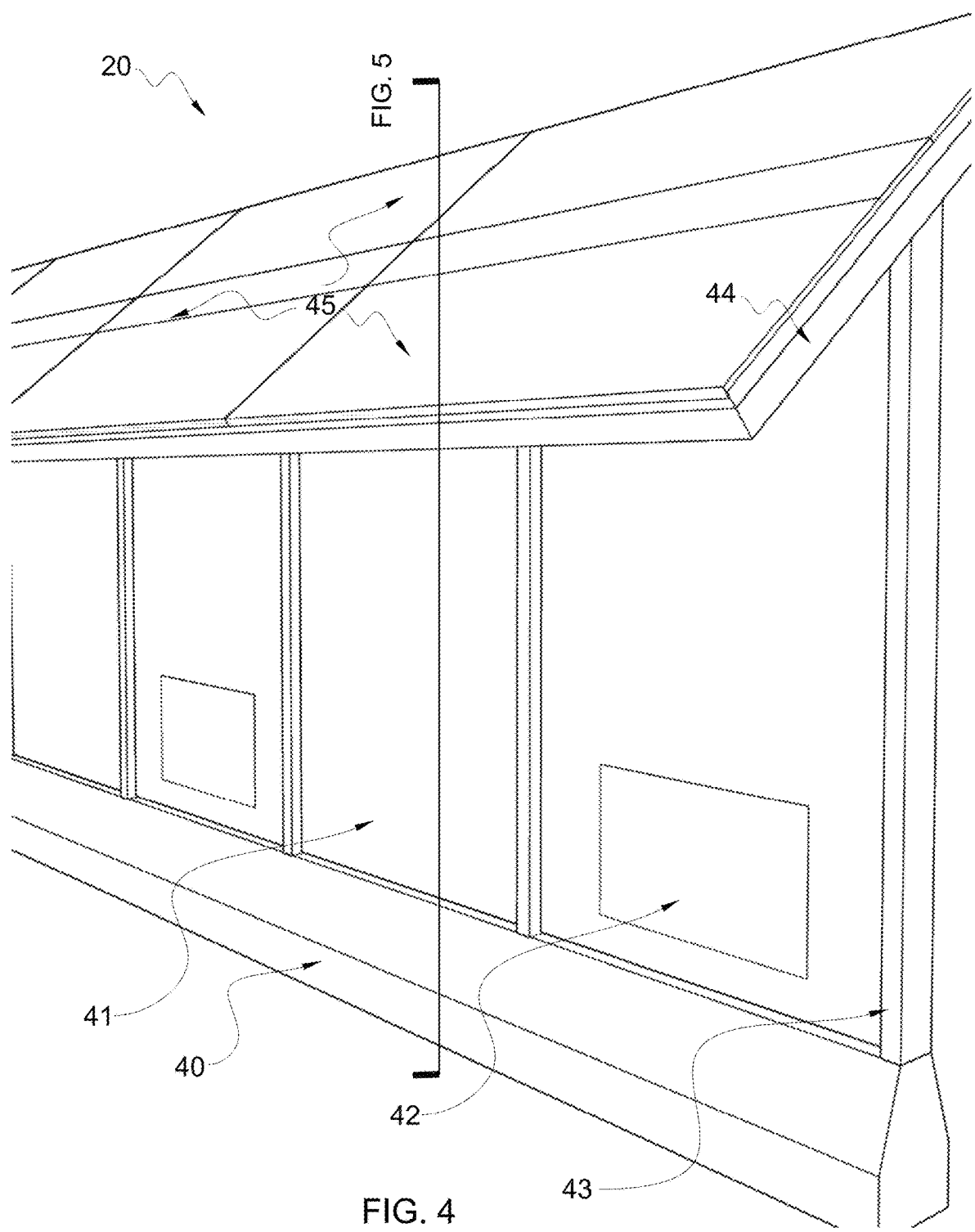
FIG. 4: 3D view of one embodiment of the invention
Figure 5:
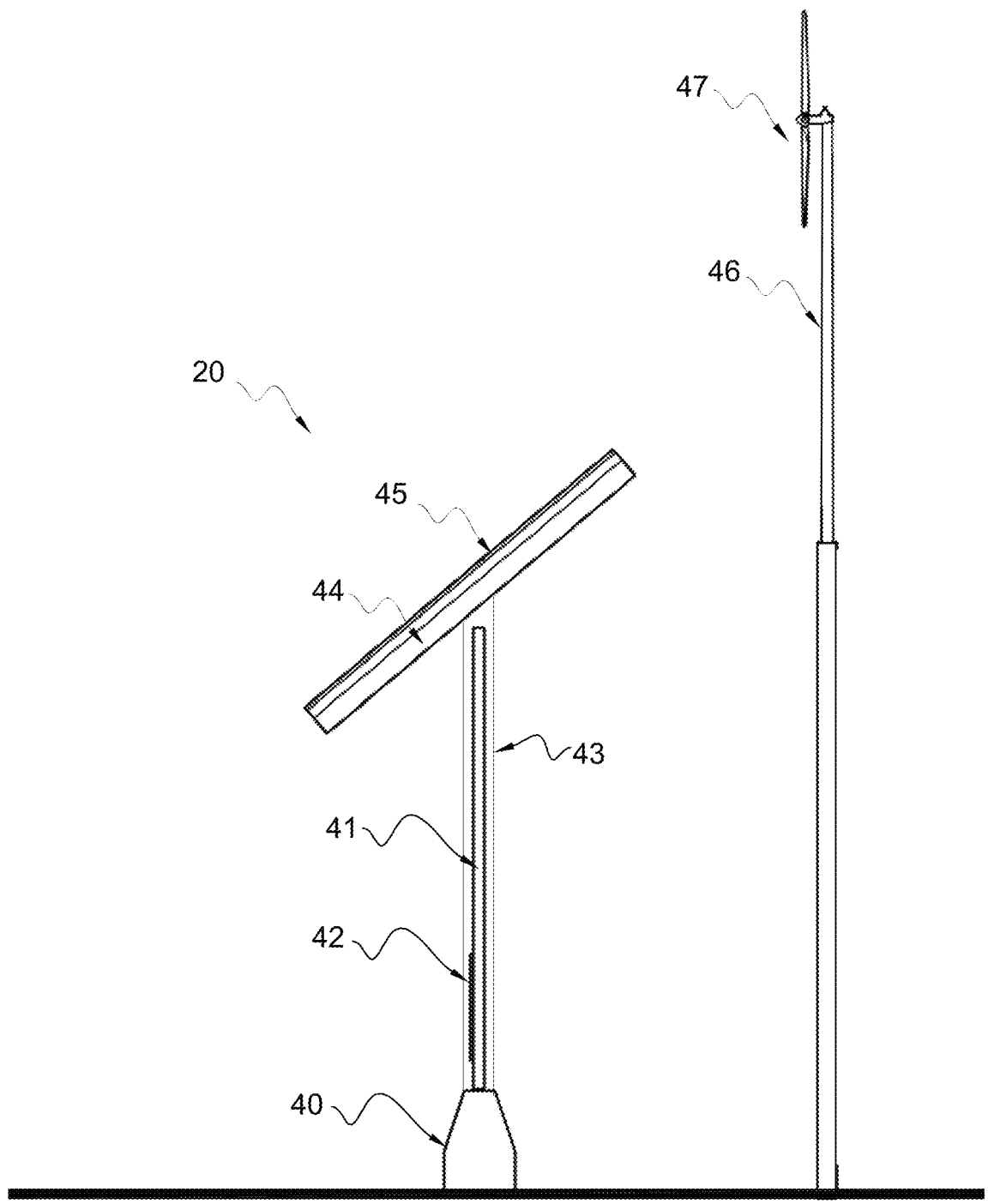
FIG. 5: Sectional view of the embodiment of the invention disclosed in FIG. 4
FIG. 6: 3D view of one embodiment of the invention

FIG. 4 and FIG. 5 disclose an embodiment of the present invention in the form of barrier wall 20 in which a canopy like structure is comprised of vertical posts 43 and inclined structural frames 44. Structural Solar Panels (SSPs) 45 are supported over inclined frames 44. SSPs 45 are similar to assembly 8 or assembly 1000 (FIGS. 15, 15a). The vertical portion of barrier wall 20 is comprised of vehicle impact barrier 40, rigid infill panels 41, advertising panels 42 and structural posts 43. Infill panels 41 can be precast concrete, fiber reinforced plastic or a sandwich assembly of composite materials. In one embodiment of the invention micro wind turbines 47 secured over posts 46 are installed in rows along barrier wall 20 to supplemental electricity output Structural Solar Panels (SSPs) 45.

Figure 6:
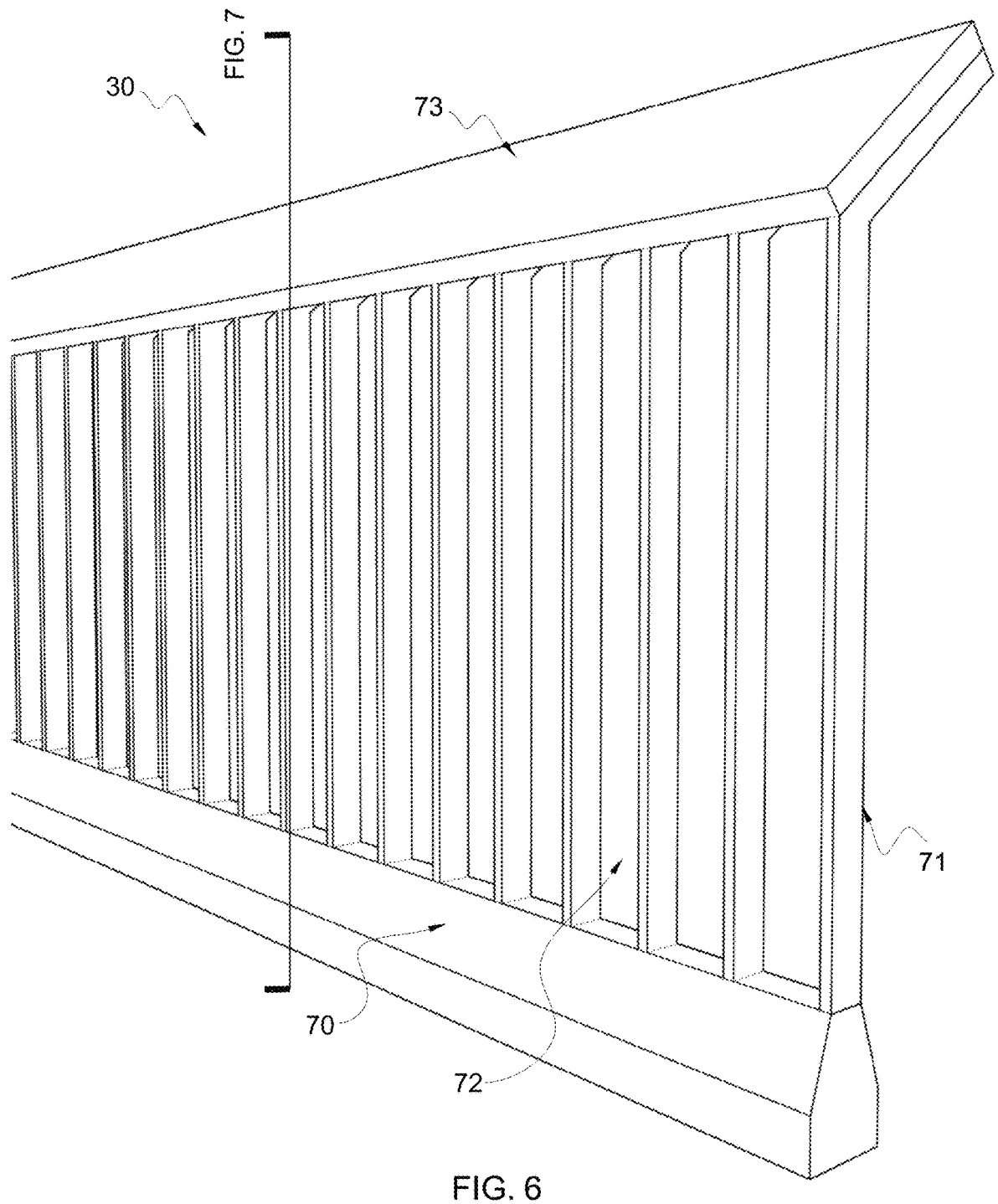
Figure 7:
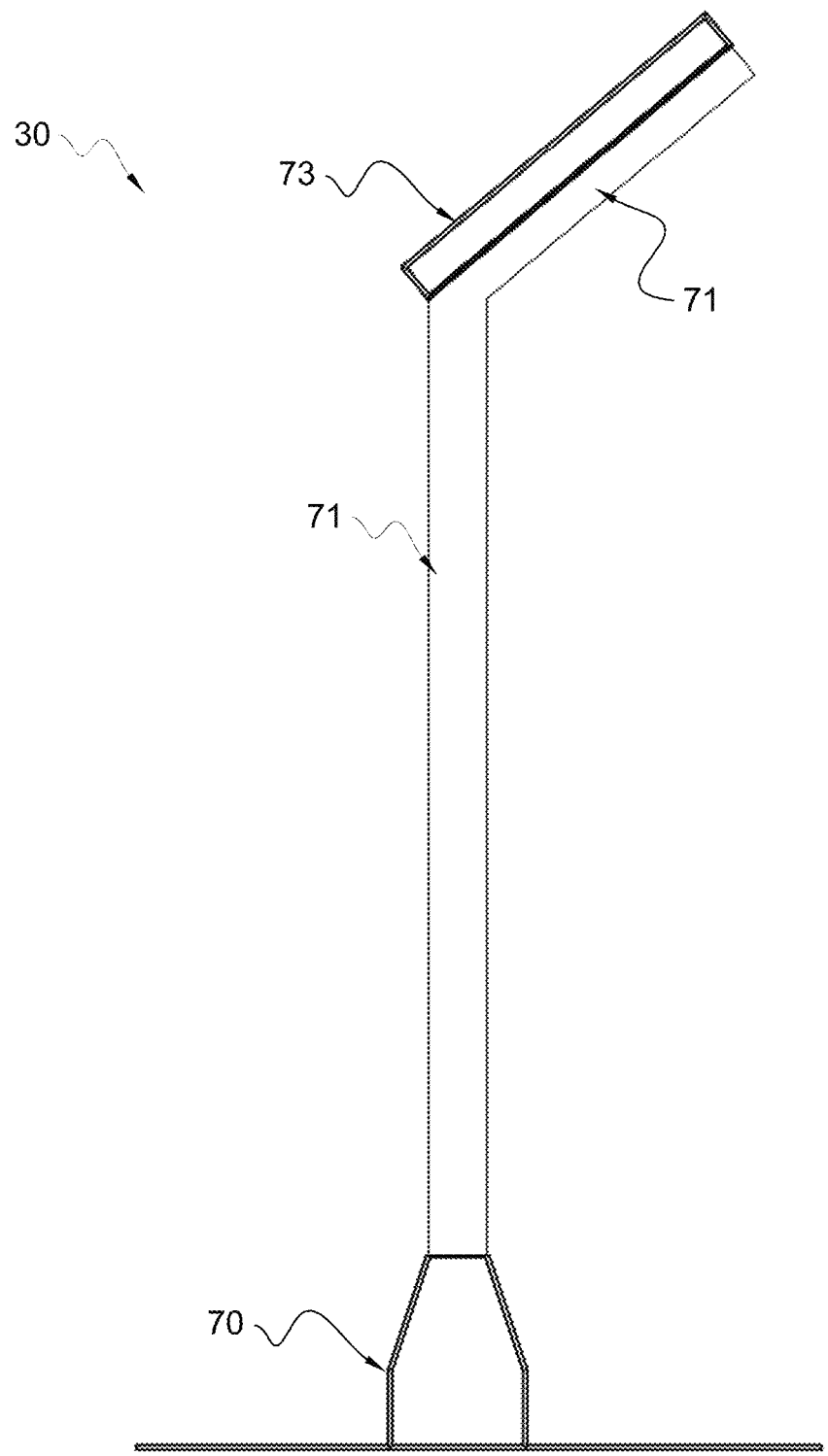
FIG. 7: Sectional view of the embodiment of the invention disclosed in FIG. 6
FIG. 8a: Flow diagram of an exemplary embodiment of the invention

FIG. 6 and FIG. 7 disclose an embodiment of the present invention in which an inclined cantilever structure 30 is comprised of structural frame posts 71 and Structural Solar Panels (SSPs) 73. Posts 71 are bent at a predetermined angle proximal to the top edge of the vertical posts 71 for maximum solar exposure. SSPs 73 (similar to assembly 8 or assembly 1000) are supported over the inclined cantilevered portion of frames 71. Vehicle impact barrier 70 can be provided if needed. Posts 71 are placed at predetermined intervals to form gaps 72 allowing visibility and security at the same time. Depending on the predetermined requirements of a project gaps 72 can be filled with rigid infill panels (not shown) if required.

Figure 8A:
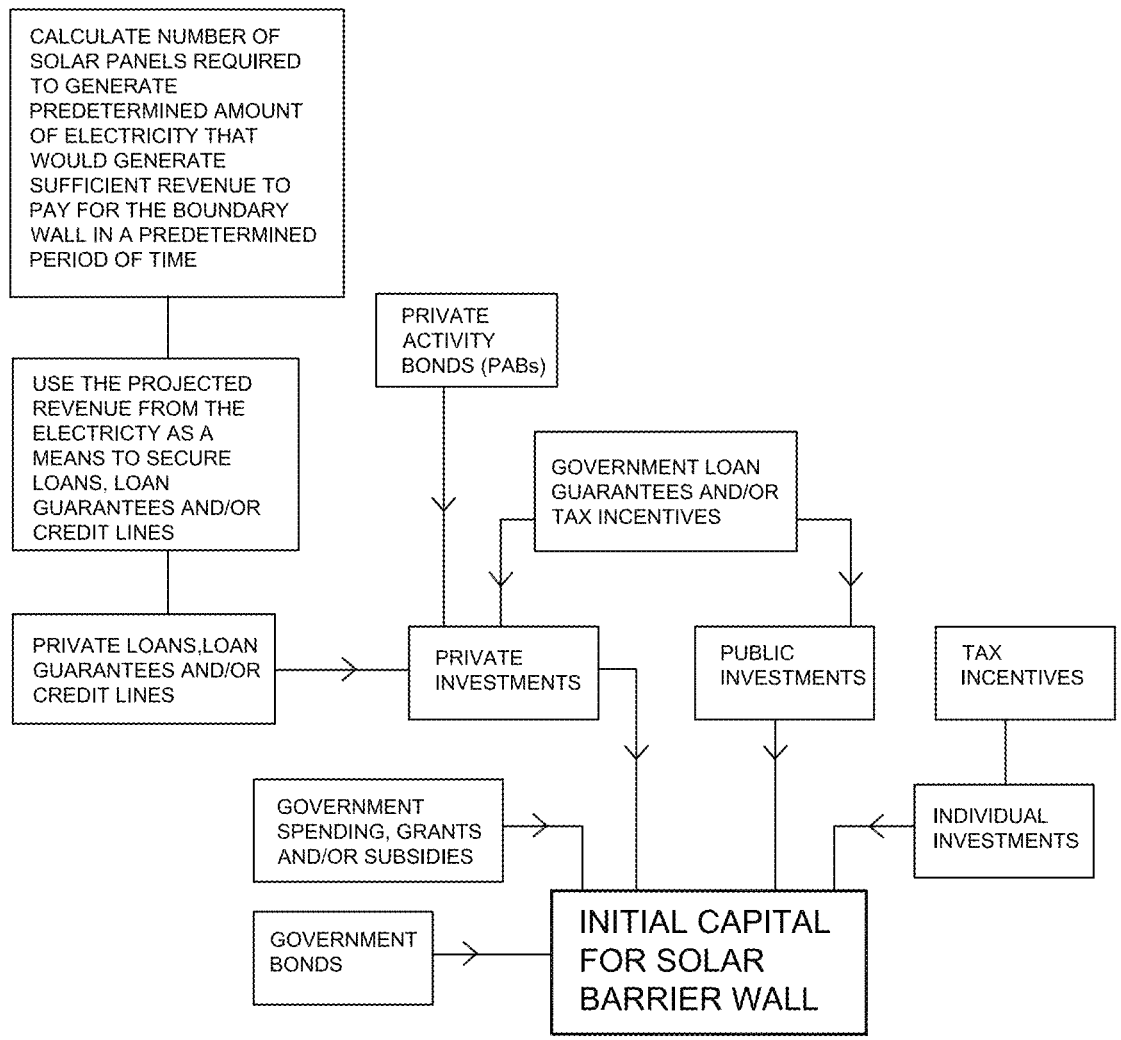
FIG. 8b: Flow diagram of an exemplary embodiment of the invention
Figure 8B:
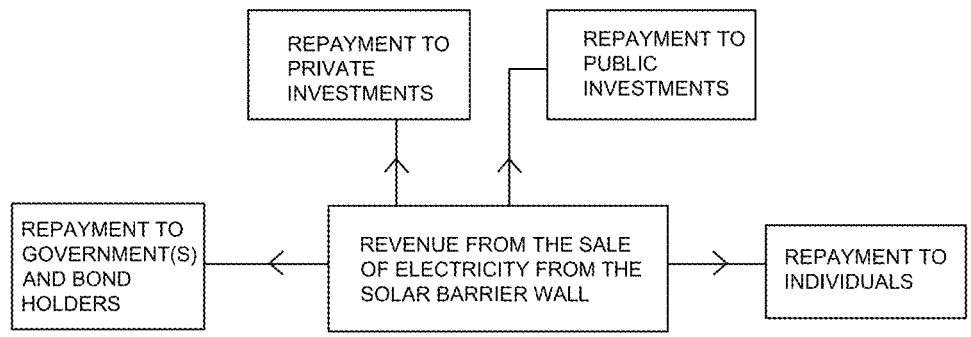

FIG. 8a discloses an exemplary method of the present invention for raising capital for a solar barrier wall disclosed in the present application. In one embodiment of the invention the initial capital for the barrier wall is raised by contributions from government(s), private investments, public investments, government bonds, Private Activity Bonds (PABs) and individual investments. Private and public investments can be backed by government subsidies, grants, loans, loan guarantees and/or tax incentives. Private loans and credit lines can be secured against the future projected revenue from the sale of the electricity from the solar wall. The aforementioned method of raising capital for the barrier walls is just one example of raising capital; a combination of aforementioned financial tools can be used depending upon the predetermined requirements of a project. Other financial tools such as creating enterprise zones, green energy rebates, tax abatements and public utility bonds to facilitate the financing of solar barrier walls are within the scope of the present invention. The aforementioned financial tools are commonly used for financing building projects. However such financial tools have never been employed for building boundary walls, because boundary walls have not been known as revenue generating. The novelty of the present invention is to make a boundary walls or other such barriers revenue generating so that the cost of building them can be financed and/or subsidized. As the solar barrier walls offer great clean energy advantages, they can also be directly funded by government spending. FIG. 8b discloses how the revenue generated from a solar barrier wall can be gradually returned to government, private investors, public investors and individuals.

Another method of paying for the inclined barrier walls particularly when used along highways is to use a portion of the sale of electricity from the barrier walls as a means to pay back the loans secured for the barrier walls. The electricity produced by the barrier walls can be used to power electric vehicles along the highways. The cost traveling by electric vehicles is substantially less than traveling by gasoline vehicles. The consumers can be taxed to use the electricity charging facilities along the highways to pay for the solar barrier walls. The electricity output from solar barrier walls installed along both sides of a highway has the potential to power most of the vehicles traveling on a typical highway. Such solar powered highways offer a great potential to reduce carbon dioxide emissions. The consumers can be asked to pay a toll to travel on these pollution free highways which can be used to pay for the barrier walls.

As many public and private entities have set goals to reduce carbon dioxide emissions, different public and private partnerships can be developed to generate clean energy from solar power. Such green energy projects can be assigned to different public or private companies to manage them. These companies can be made fully or partially responsible for constructing the barrier walls and maintaining them in return for reaping financial benefits from them.

Figure 10:
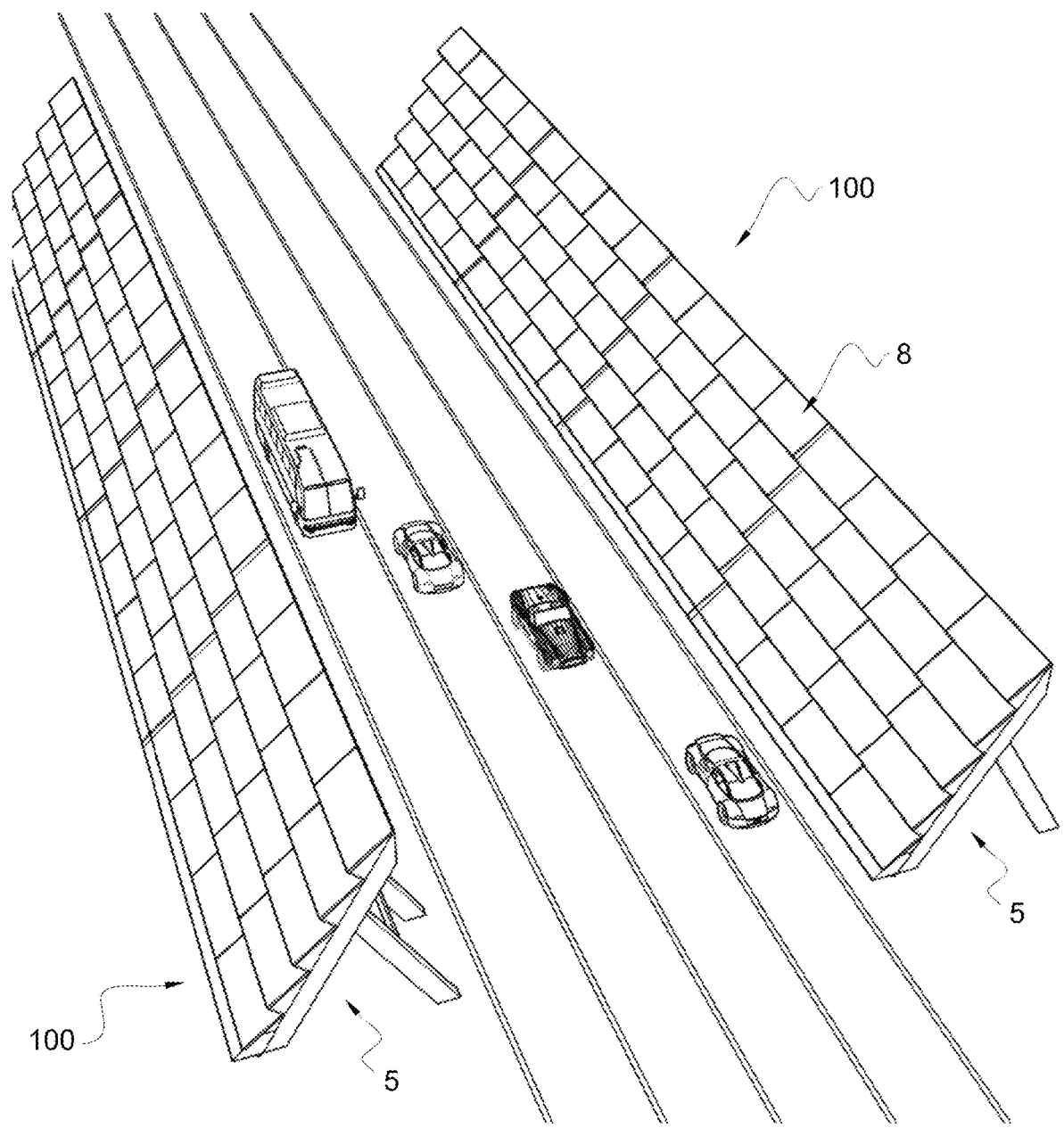
FIG. 10: 3D view of one embodiment of the invention
Figure 11:
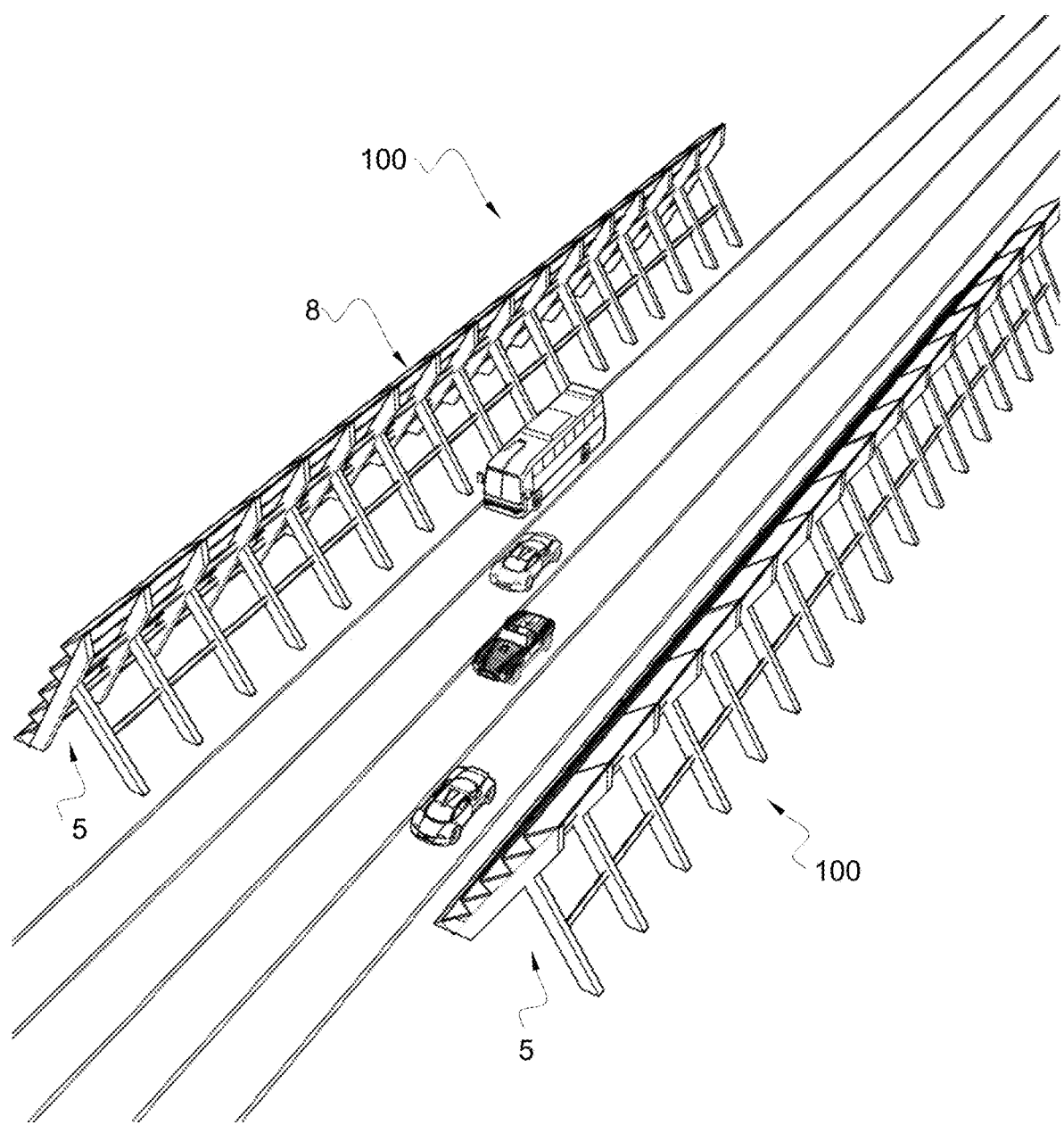
FIG. 11: A 3D view of the embodiment disclosed in FIG. 10
FIG. 12: 3D view of one embodiment of the invention
Figure 12:
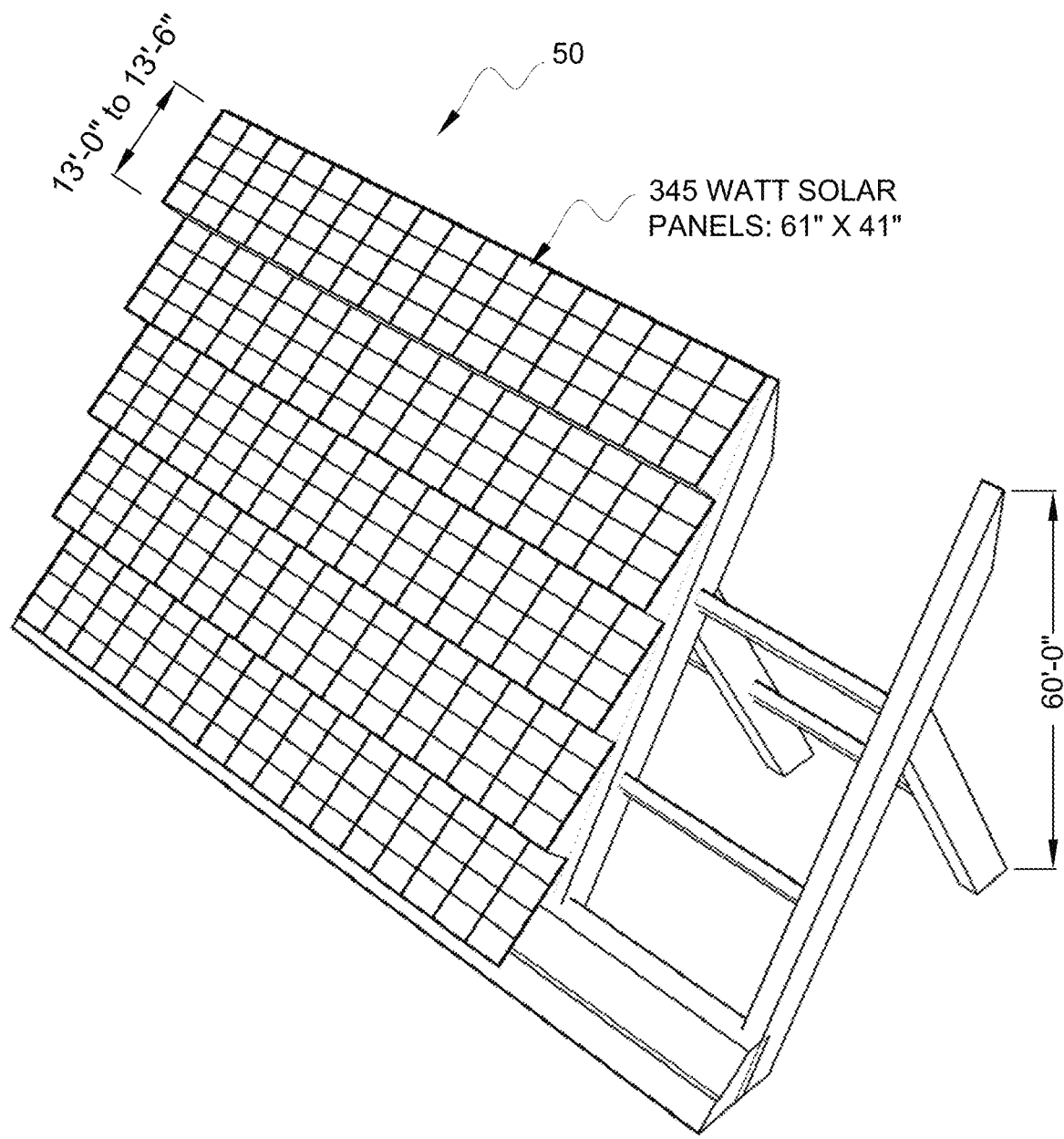

The success of the aforementioned methods of securing loans and loan guarantees for solar barrier walls depends upon demonstrating viable return on investment (ROI) to the backers of green energy projects and investors. It involves predetermining the number of solar panels that would be required to generate sufficient amount of electricity to pay for the barrier walls overtime. It involves designing the barrier walls accommodating these predetermined number solar panels. The following calculations show an example of how a 60 feet (18.29M) high 1000 mile (1609.34 KM) long barrier wall 50 (FIG. 12 shows partial wall) would have a Return On Investment period of about 30-40 years. Barrier wall 50 is assumed to be somewhere in a relatively sunny region such as southern United States. Similar calculations are also applicable for two 30 feet high solar barriers 100 installed on both sides of a highway running in the east-west direction somewhere in the southern region of the United States (FIGS. 10 and 11).

The following electricity output calculations are computed with assistance from the experts at National Renewable Energy Lab (www.NREL.gov):

Total length of 1000 mile (1609.34 KM) long barrier wall 50 (FIG. 12): 1000 miles (1609.34 KM)=5,280,000 FT (1609344 Meters)

The 60 feet (18.29M) high wall will have 20 rows of solar panels in five offsets of 13'-0" (3.96M) to 13'-6" (4.115M) each.

Surface area for solar panels for one feet length of wall: 13×5=65 Sq. Ft. (6.039 SQ. M)

Total area of solar panels across the entire length of the wall: 5,280,000×65=343200000 Sq. Ft.=31884320 Sq. Meter Average solar radiation available along the southern region of the United States (based on NREL maps): 6.5 kWh/Sq. M/day Solar radiation output from the wall per day: 31884320 Sq. M×6.5=207,248,080 kWh Annual solar radiation output from the wall: 207248080×365=75,645,549,200 kWh Annual electricity output using 20% efficiency solar panels: 75,645,549,200×0.20=15,129,109,840 kWh (15,129 GWh)

Assumed system losses due to dust on panels, shading, wiring etc.=14%

Annual electricity output after 14% losses=15,129,109,840 kWh×14%=13011034462 kWh (13,000 GWh)

Retail value of electricity at 120/kWh=13011034462 kWh×0.12=$1.56 Billion/Yr 13,000 GWh of electricity can power more than one million homes using an average 1000 kWh per month. Or can be used to pump more than 6.4 trillion gallons of water for irrigation. Or it can be used to power 4.6 million cars running about 12,000 miles per year. This would reduce about 4 million metric tons of carbon dioxide emissions per year. The solar barrier wall's output would be equivalent to a medium to large size nuclear plant. For example the output from unit 2 of the Indian Point nuclear plant at New York is around 8,842 GWh/year.

Calculations based on number of solar panels and PV Watts calculator by NREL.gov:

(The following calculations are based on SunPower X-Series 345 watt solar panels.)

First calculate output from 1 mile (1609.34M) length of barrier wall 50: 1 mile barrier wall=5,280 FT (1609.34M)

Number of 61" (1.549M) long panels in one row across 1 mile (1609.34M) length of the wall: (5,280×12) inch÷61 inch=1,039 panels (1609.34M÷1.549M)=1,039 panels Number of panels in 20 rows (see Fig. above): 1,039×20=20780 panels Total system size based on 345 W panels: 20780× 345=7169100 W=7169 kW Using PV Watts (NREL gov) calculator to determine electrical output for one mile: Specify location of wall>Enter Nogales, Tucson, Ariz.

Module type>Premium

Array type>Fixed open rack

System losses due to wiring etc.>14%

Tilt angle from horizontal axis>40°

Azimuth>180°

Go to PV Watts results>Yearly output from 1 mile length of the wall: 13,130,789 kWh per year Yearly output from 1000 mile length of the wall: 13,130,789×1000=13,130,789,000 kWh=(13,130 GWh) per year Retail value at 120/kWh=13,130,789,000× 0.12=$1.58 billion per year Rough cost of the solar panel system installation:

Total system size=7169 kW (for 1 mile)×1000 miles=7,169,000 kW

Cost of solar system installation based on factory direct price of $1/Watt (or $1000/kW): 7,169,000×1000=$7,169,000,000=$7.2 billion Assumed cost of wall frame: $21.6 billion Transmission lines, substations etc.=$1.2 billion Cost of wall+solar panels+transmission lines: ±$30 billion The actual revenue from the electricity will be lower than the projected $1.58 billion retail value depending upon how the electricity is sold. To maximize return on investment, the electricity need not be sold thru traditional utility channels at wholesale price which is generally half the retail value. Instead the electricity may be sold directly to local consumers. This would benefit local communities as they would get a good price, and would also generate decent revenue. For example if the electricity is sold at 8¢/kWh it would generate $1 billion revenue per year which can be used to pay estimated $30 billion cost of the barrier wall in about 30 years. Given the uncertainty about pricing a safer estimate for return on investment may be 30-40 years.

Similarly when wind turbines are used to supplement electricity output of solar barrier wall (refer to FIG. 21) a reasonable return on investment can be achieved for wind turbines. The following calculations show an example of using 15 KW wind turbines as manufactured by Bergey Windpower, OK 73069 USA installed at 120 FT height along a 1000 mile (1609.34 KM) long solar barrier wall. In this example, the average wind speed of the installation is assumed to be 5.5 meters per second (12.3 miles per hour) at 120 feet (36.58M) height. The electricity output would be higher if higher wind speeds are available at a specific geographic location. The following calculations are prepared with the assistance from Bergey Windpower:

Rotor diameter: 31.5 ft. (9.6M)
Turbine spacing: 75-feet (22.86M)
(two rows staggered with 150 ft. (45.72M) spacing)
Average annual wind speed: 5.5 m/s (12.3 mph@120 FT height)
Turbine height: 120 ft. (36.58M)
Cost per installation: $70,000.00
Number of wind turbines along a 1000 mile long solar barrier wall: 70,400
(The turbines can be staggered in two rows with 150 feet (45.72M) distance between the turbines. See FIG. 21 as an example.)
Total cost of installation: $4,928,000,000
Projected output per turbine at 5.5 m/s (12.3 mph): 33,500 kWH/year
Electric output from 70,400 turbines: 2,358,400,000 kWH/year
Electricity retail value at $ 0.08/kWH: $188,672,000
Estimated return on investment (ROI): 26 years Due to price variations, inflation costs, site preparation costs, transmission line costs etc. the actual ROI may be longer.

Figure 9A:
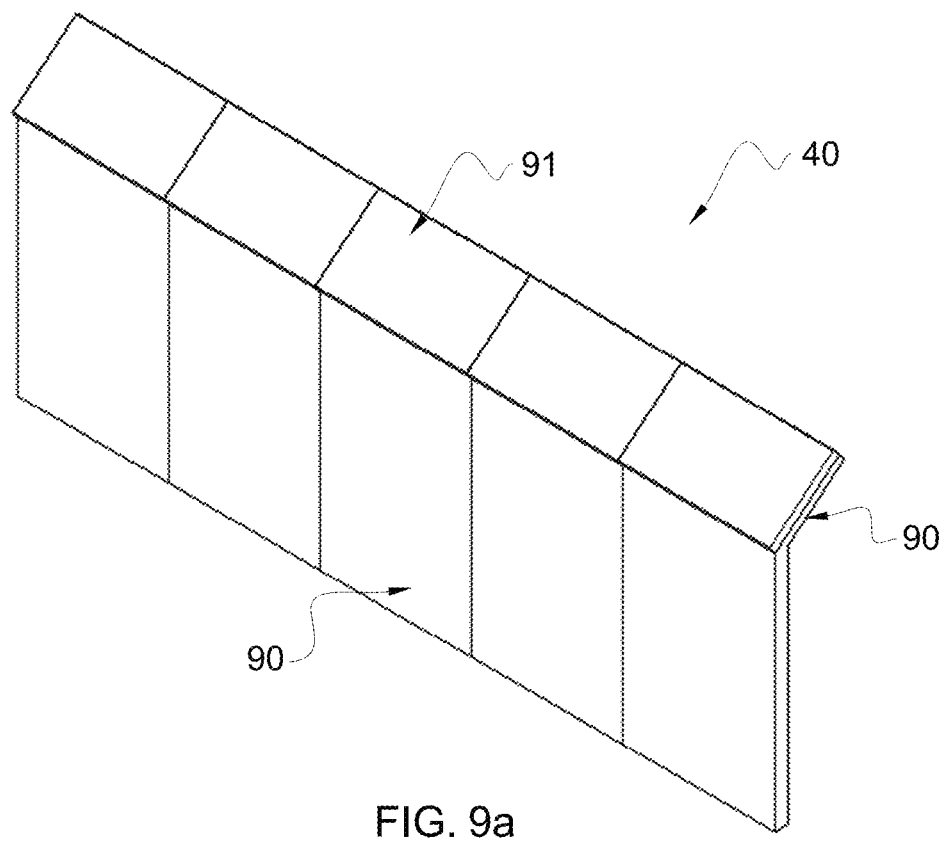
FIG. 9a: 3D view of one embodiment of the invention

FIG. 9a discloses an embodiment of the invention in which barrier wall 40 is comprised of inclined cantilevered precast concrete panels 90 which are joined side by side.

Precast panels 90 are bent proximal to the top end at a predetermined angle for maximum solar exposure. Solar panels 91 are mounted over the bent portion of panels 90. Solar panels 91 can be photovoltaic, solar film (or similar technology).

Figure 9B:
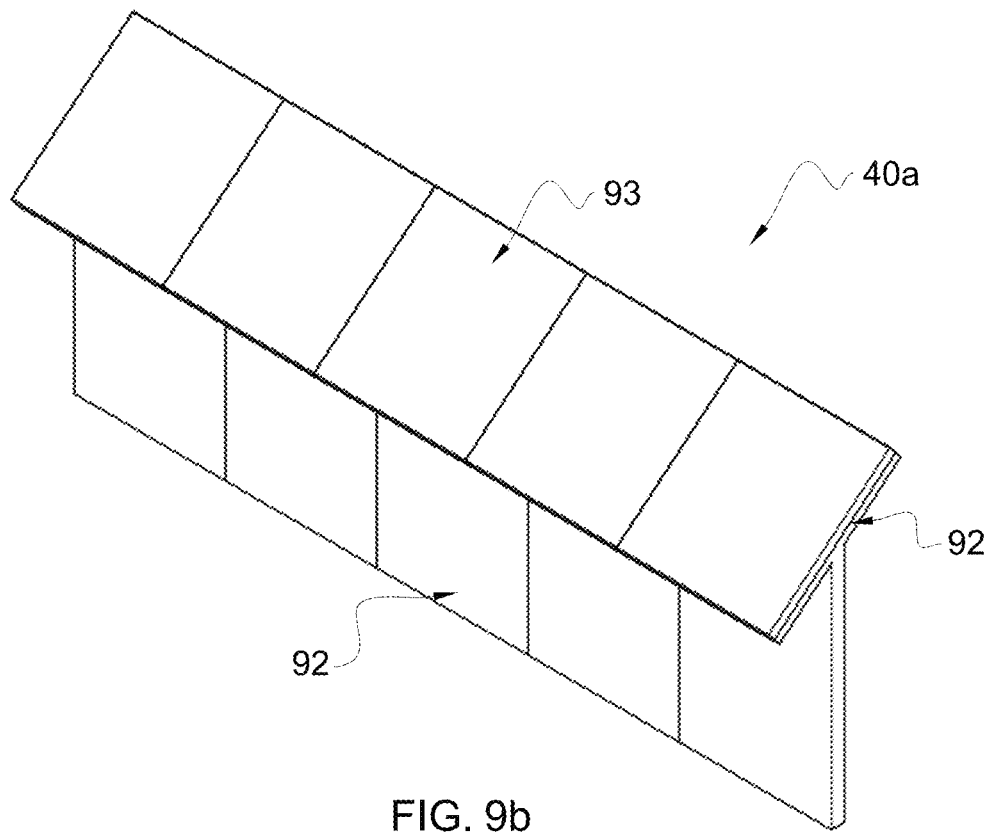
FIG. 9b: 3D view of one embodiment of the invention

FIG. 9b discloses an embodiment of the invention in which barrier wall 40a is comprised of tilted 'T' shaped precast concrete panels 92 which are joined side by side. The top portion of the 'T' shape is tilted at a predetermined angle for maximum solar exposure based on the geographic location of a project. Solar panels 93 are mounted over the titled portion of the 'T'. Solar panels 93 can be photovoltaic, solar film (or similar technology). Panel 92 can be a single unit or it can be formed in two pieces for shipping convenience: A vertical portion of the 'T' shape and a tilted top portion of the 'T' shape. The tilted top portion of the 'T' shape can be joined with the vertical portion of the 'T' on site with structural connections (not shown) to form the tilted 'T' shape.

FIGS. 10 and 11 disclose an embodiment of the invention comprising two solar powered inclined barriers 100 installed on both sides of a highway. Barrier walls 100 are similar to barrier wall 10 (FIGS. 1 and 2). In this embodiment inclined frame structures 5 are used to support Structural Solar Panels (SSPs) 8. The orientation of barriers 100 in the horizontal plane and the inclination of solar panels is predetermined based on the geographic location of a project to gain maximum solar exposure. For optimal electricity output the highway should run somewhat in the east-west direction such that solar panels 8 face south in the northern hemisphere. FIG. 11 shows the back view of barriers 100.

Figure 13:
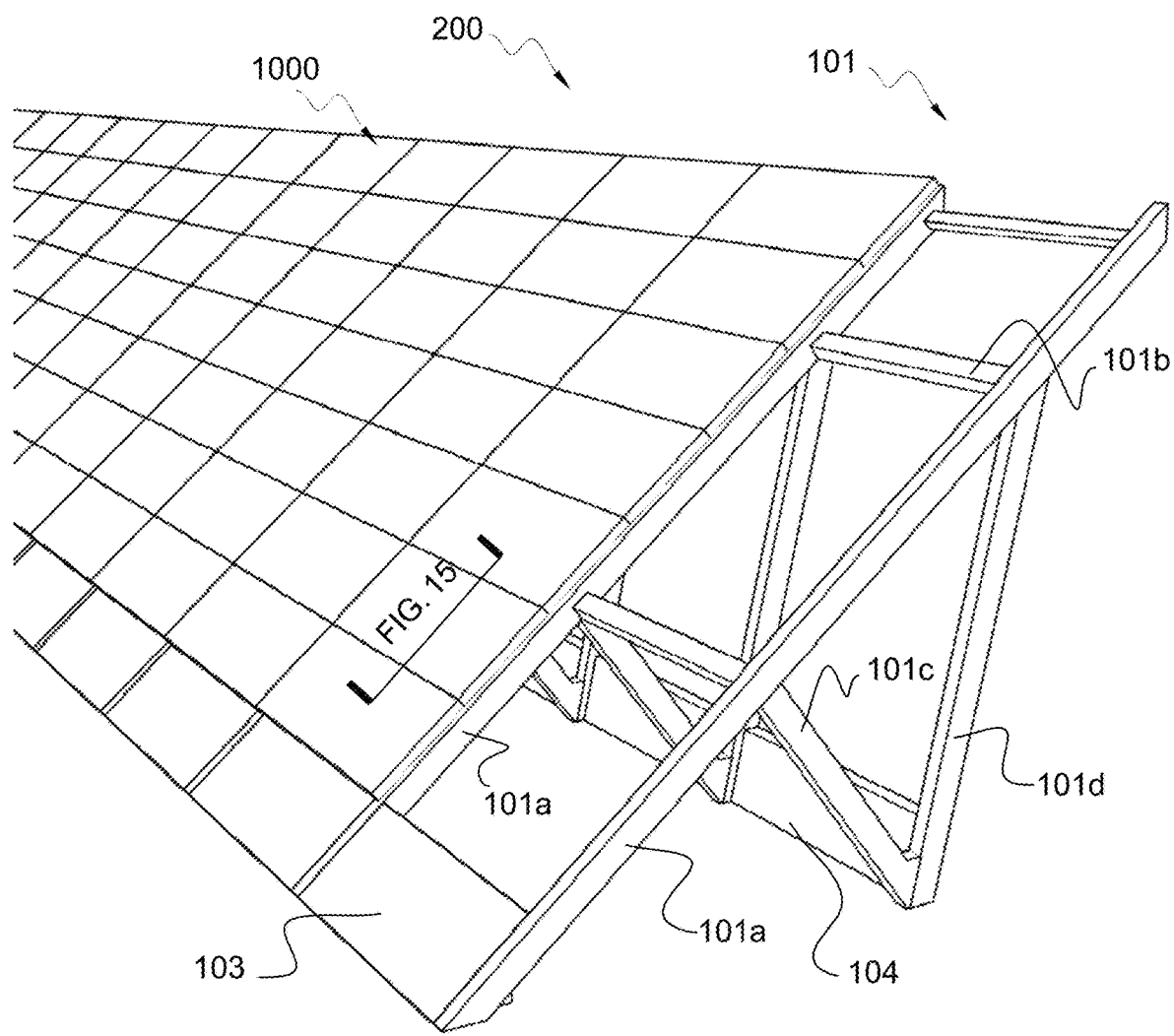
FIG. 13: 3D view of one embodiment of the invention

FIG. 13 discloses an embodiment of the invention in which barrier wall 200 is comprised of an inclined frame structure assembly 101. Assembly 101 is comprised of a plurality of inclined engineered framing members 101a spaced at predetermined intervals. Framing members 101a are supported by structurally engineered cross bracing members 101b and lateral bracing members 101c and 101d. Lateral bracing members 101c and 101d are inclined at predetermined angles to resist the forces imposed by inclined frames 101a. Lateral bracing members may be joined at the base as shown in FIG. 13 or they may be independent of each other. Vehicle impact barriers 103 are provided at the base of framing members 101a; and vehicle impact barriers 104 are provided at the base of lateral bracing members 101d. Vehicle impact barriers may be designed as cross bracing members to support frames 101a and lateral bracing members 101d or they may be independent of the structure. The foundations of barrier wall 200 are not disclosed as part of this specification; they will need to be engineered based on the soil bearing capacity of a specific geographic location of the installation. Structural Solar Panels (SSPs) 1000 are used as the solar generating component of barrier wall 200. Structural Solar Panels (SSPs) 1000 are novel because not only they generate electricity, they are structural and can span directly between framing members 101a without the need for a structural substrate or intermediate runners. This method speeds up construction and saves installation costs.

Figure 14:
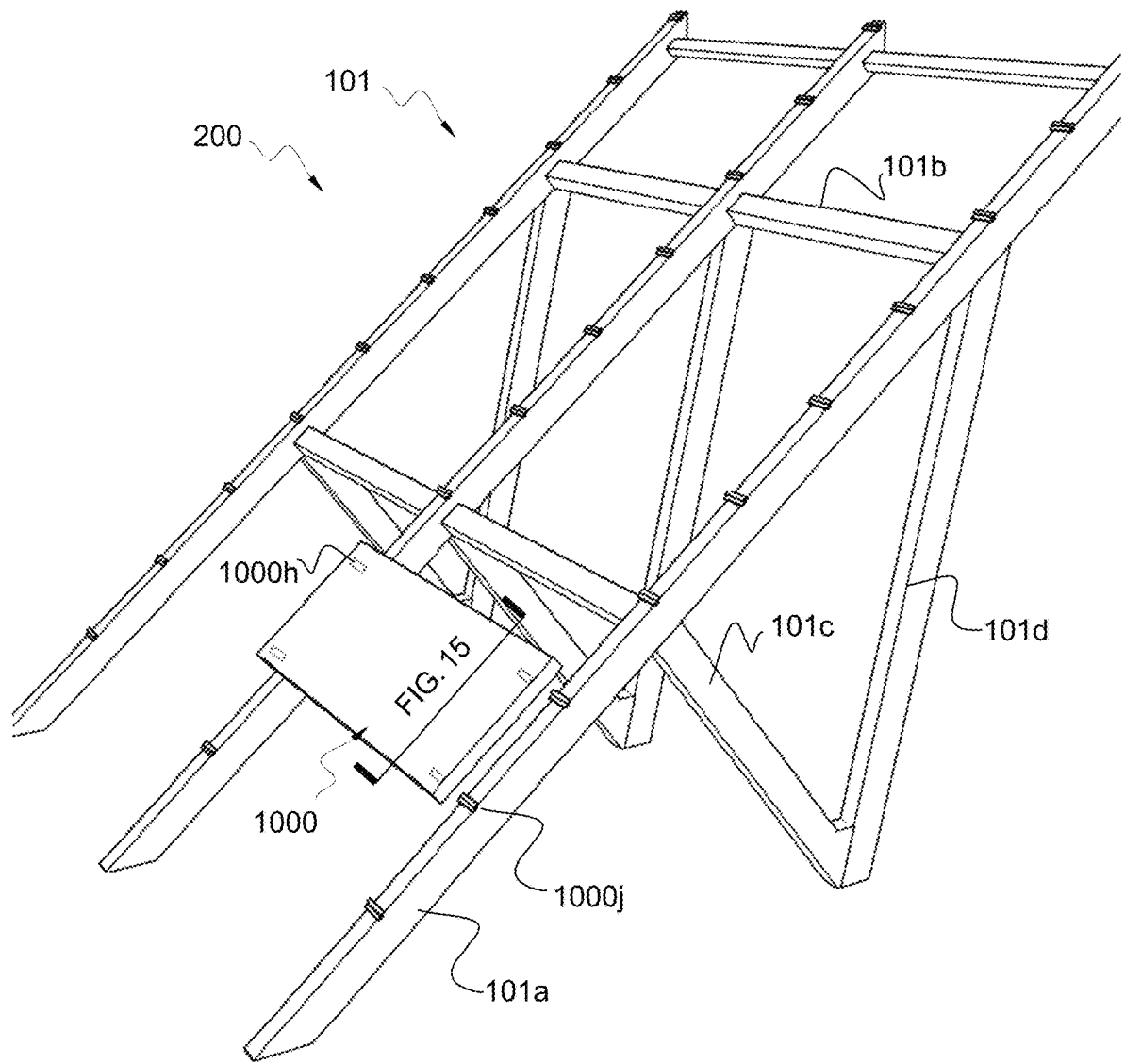
FIG. 14: A 3D view of the embodiment disclosed in FIG. 13
FIG. 15: Sectional view of Structural Solar Panels (SSPs) 1000 shown in FIGS. 13 and 14
FIG. 15a: Detailed sectional view of Structural Solar Panels (SSPs) 1000 shown in FIG. 15
FIG. 16: A 3D view of the embodiment of the invention disclosed in FIGS. 13 and 14
FIG. 17: 3D view of one embodiment of the invention
Figure 16:
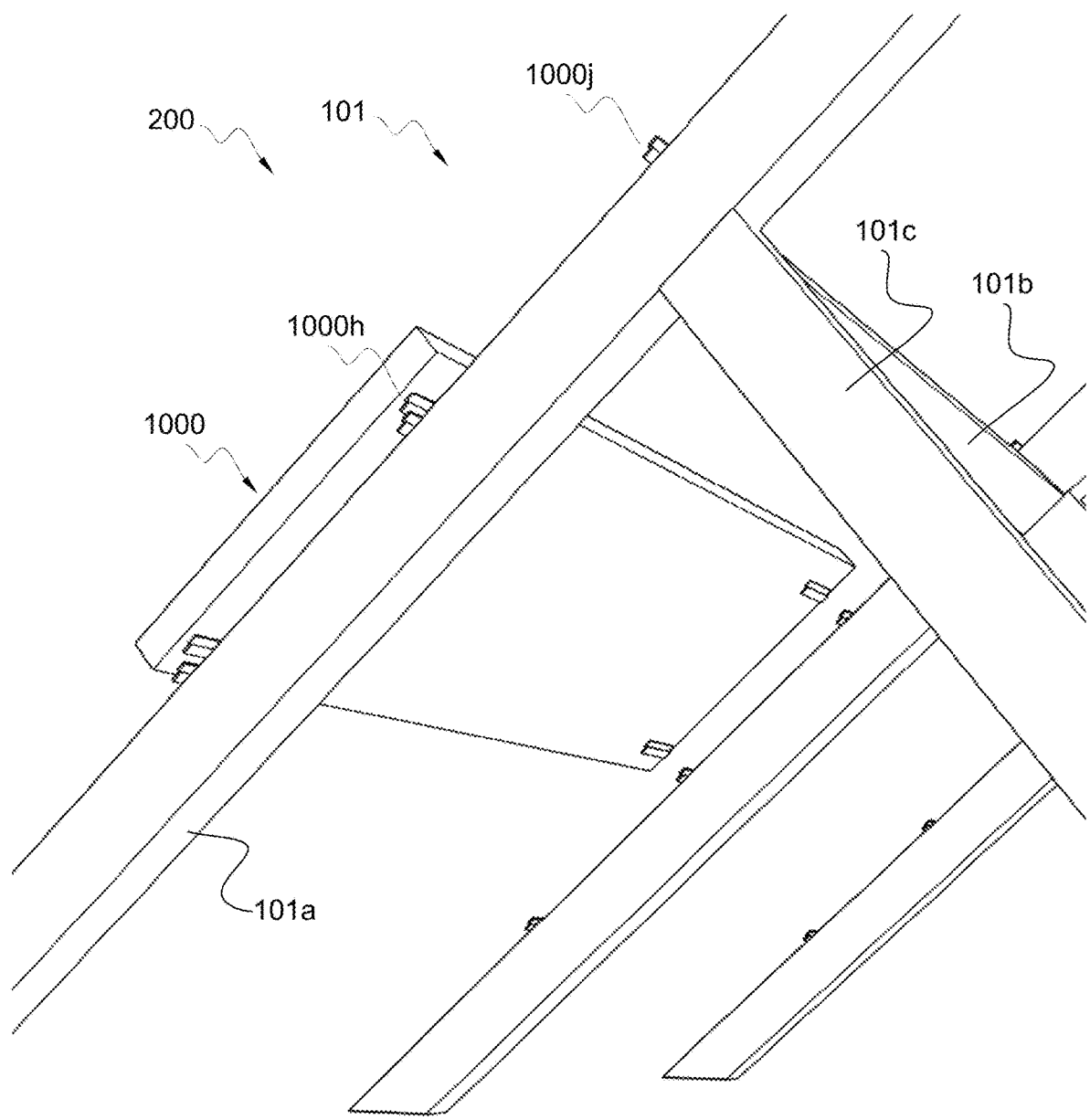

FIGS. 14, 15 and 16 describe the method of installing Structural Solar Panels (SSPs) 1000 to inclined framing members 101a. Structural members 101a, 101b, 101c and 101d can be precast concrete or structural steel that can be assembled in the field using structural connections (not shown). Plurality of 'Z-clips' 1000j are attached to inclined framing members 101a at predetermined intervals. Structural Solar Panels (SSPs) 1000 are provided with 'Z-clips' 1000h matching the spacing of 'Z-clips' 1000j such that they can be readily locked in place with each other securing SSPs 1000 to frames 101a.

FIG. 15 discloses partial section through Structural Solar Panel (SSP) assembly 1000 shown in FIGS. 13 and 14. FIG. 15a shows an enlargement of SSP assembly 1000 showing placement of SSPs adjacent to each another. Structural Solar Panels (SSPs) 1000 are comprised of structural assembly 1000s and solar cells 1000e that are attached to structural assembly 1000s as a single manufactured unit. Structural assembly 1000s is comprised of perimeter frames 1000a, outer sheathing 1000b, inner sheathing 1000c and infill material 1000d. In another embodiment of the invention the infill 1000d may be omitted and assembly 1000s can be made structurally sound by using stiffners or intermittent frames (not shown) within assembly 1000s.

Structural assembly 1000s can be made similar to Structural Insulated Panels (SIPs) which are commonly used in the construction industry. SIPs have rigid inner and outer sheathings and an inner foam core. Assembly 1000s can also be made like sandwich-structured composites or other such assemblies that are fabricated by attaching two thin but stiff skins to a lightweight but thick core. Assembly 1000s may also be made like hollow metal doors that use outer thin sheet metal skins and several stiffeners inside the skin of the door to make the door sturdy but lightweight. For more information on SIPs' and 'sandwich-structured composite' panels refer to Wikipedia.org by searching these terms on the website or visiting sips.org. Assembly 1000s may also be formed like honeycomb (or other hollow shapes) as inner core and thin but rigid outer sheathing. Some examples of conventional structural composite panels can be found at websites: strongwell.com, structall.com and alro.com. The inventive step taken for the novel Structural Solar Panels 1000 is that it combines structural assembly 1000s with solar cells 1000e to form integrated assembly 1000. The objective is to streamline the construction process. For example mounting of conventional solar panels on rooftops using SIPs requires installation of rails and runners on SIPs. This process is labor intensive and damages the SIPs because several puncturing holes must be made into the SIPs. The present invention combines SIPs and solar panels into a single unit by manufacturing solar cells or solar film directly over structural sandwich 1000s for fast and easy installation. Structural Solar Panels 1000 (SSPs) are intended to be factory finished with weather resistant outer transparent casing 1000f, perimeter channel guards 1000g, Z-clips 1000h, rubber/neoprene gaskets 1000i and electrical connections (not shown). It is the intent of the applicant to pursue an independent claim for SSPs because this novel approach can streamline the solar panel installation process, not only for the solar panel equipped barriers but also elsewhere in residential and commercial construction.

The choice of materials for Structural Solar Panels (SSPs) 1000 can be predetermined based on the predetermined requirements of a project. For example if sound insulation is a governing factor for sound attenuating solar barriers installed along highways, infill material 1000d can be glass wool or mineral wool. When fire retardation is a prime factor for solar panel equipped fire barriers around a fire zone, an appropriate fire retarding infill material such as gypsum can be chosen. When security is a primer factor for a solar panel equipped security barrier, the infill material can be precast concrete. Additionally panel breakage sensors can be attached to Structural Solar Panels (SSPs) or imbedded in the SSPs. When temperature control is a prime factor for Structural Solar Panels (SSPs) used as a part of residential or commercial construction appropriate infill material having predetermined insulation values can be chosen as infill material 1000d. When water resistance is a prime concern for Structural Solar Panels (SSPs) used in residential or commercial construction appropriate outer sheathing 1000b can be made of water resistant materials such as reinforced fiberglass (FRP). If the same assembly also requires fire resistance properties, the inner sheathing member 1000c can be made of gypsum board or other fire resistant material. When insulation, sound attenuation or fire resistance is not required, infill 1000d can be omitted and structural integrity of panel 1000 can be maintained by using stiffners and/or additional framing members (not shown) within structural assembly 1000s.

Figure 17:
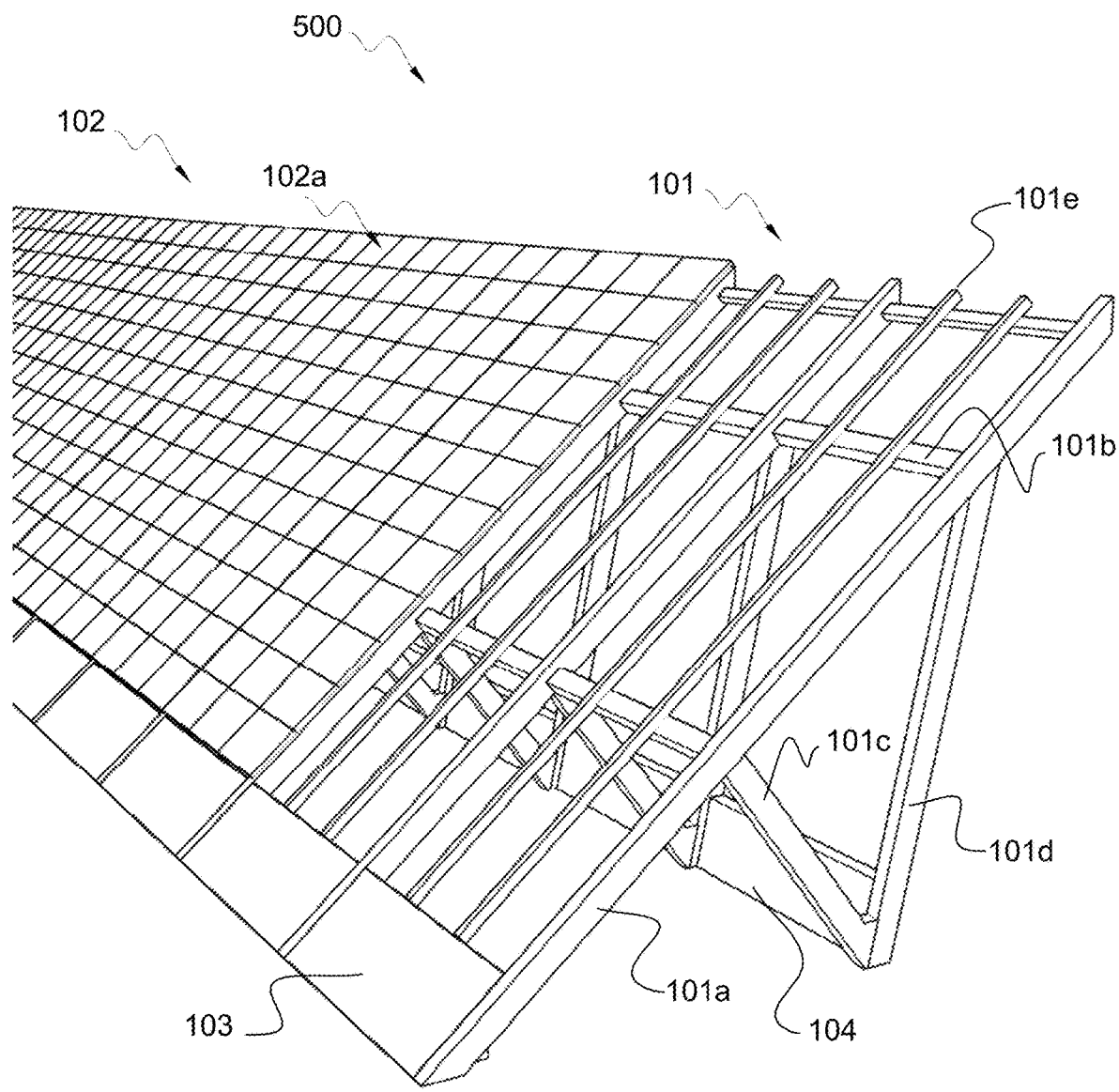
Figure 18:
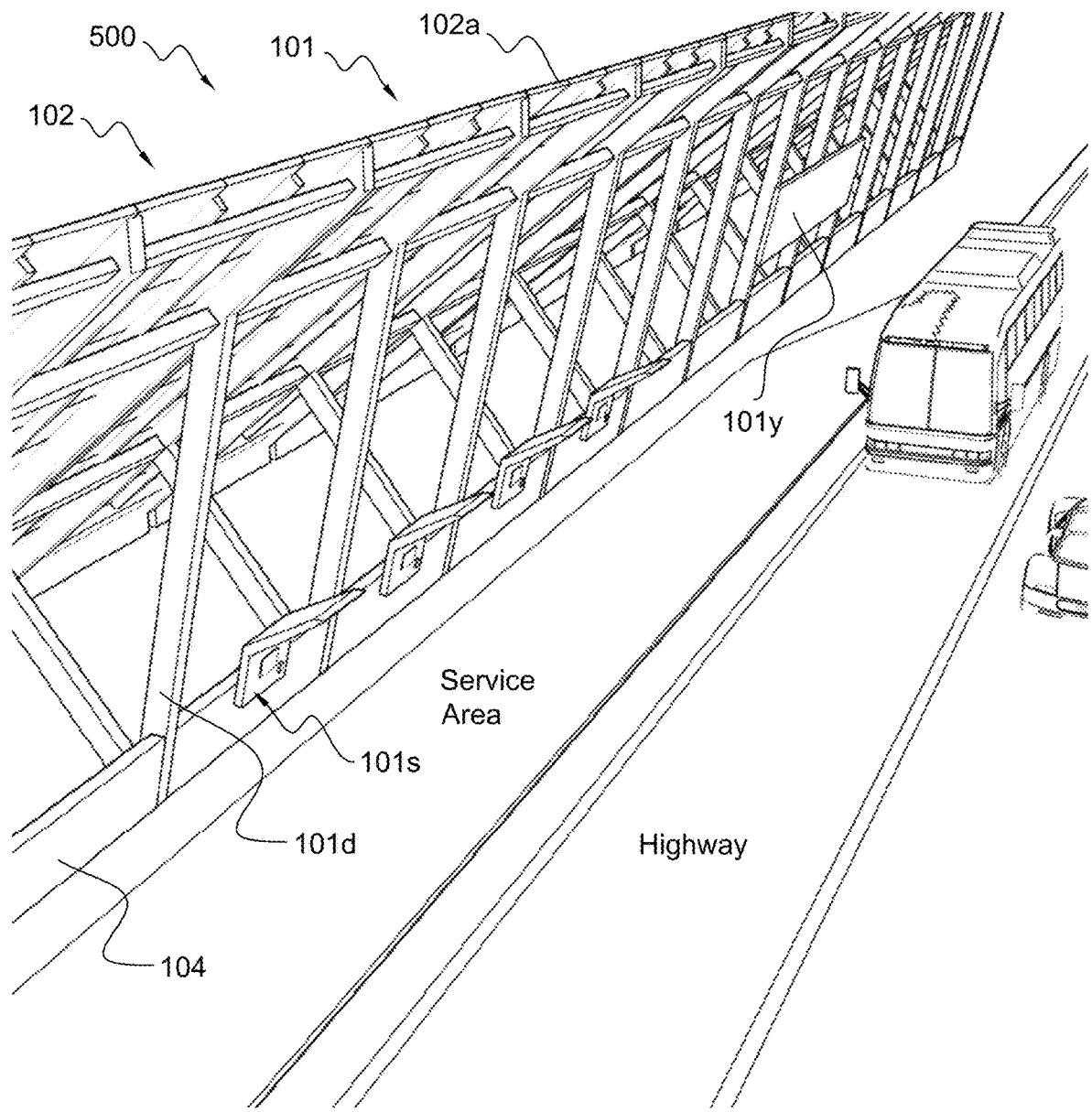
FIG. 18: A 3D view of one embodiment of the invention disclosed in FIG. 17
FIG. 19: A sectional view of one embodiment of the invention disclosed in FIG. 17
FIG. 20: 3D view of one embodiment of the invention
Figure 19:
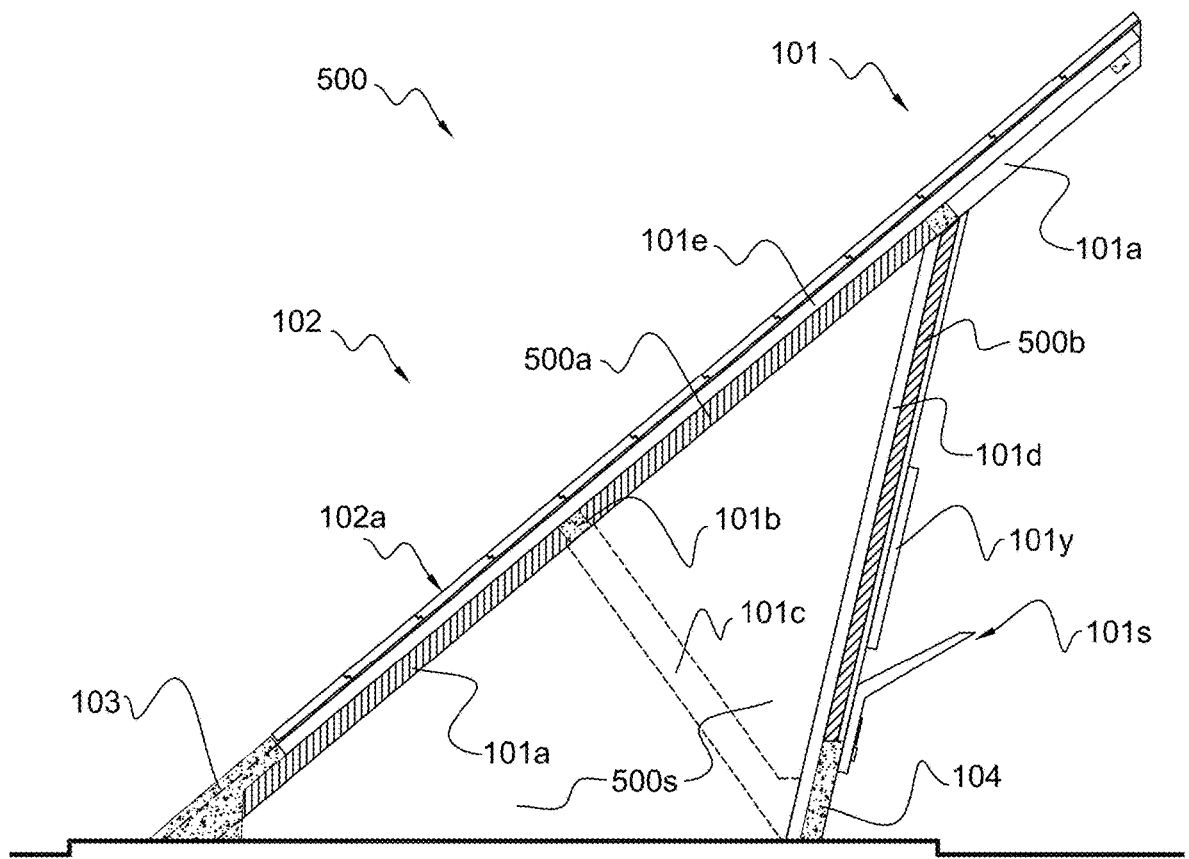

FIGS. 17, 18 and 19 disclose an embodiment of the invention in which barrier wall 500 is comprised of inclined frame structure assembly 101. Assembly 101 is comprised of a plurality of inclined engineered framing members 101a spaced at predetermined intervals. Framing members 101a are supported by structurally engineered cross bracing members 101b and lateral bracing members 101c and 101d. Lateral bracing members 101c and 101d are inclined at predetermined angles to resist the forces imposed by inclined frames 101a. Vehicle impact barriers 103 are provided at the base of frames 101a; and vehicle impact barriers 104 are provided at the base of lateral bracing members 101d. Barrier wall 500 is comprised of conventional solar panels 102a forming solar array 102. Solar panels 102a are installed over pluralities of metallic runners 101e secured to cross bracing members 101b. Runners 101e are spaced at predetermined distances to provide support for solar panels 102a. Solar panels 102a are attached to runners 101e and framing members 101a. Solar array 102 is intended to face the sunward direction for the entire length of barrier wall 500 for maximum solar exposure. FIG. 18 shows the back view of barrier wall 500 disclosing how electric vehicle charging stations 101s and advertising panels 101y can be integrated with barrier wall 500 when used along a highway. FIG. 19 discloses an embodiment of the present invention in which space 500s under barrier wall 500 is made usable by enclosing it with weather resistant partitions 500a and 500b. Space 500s can be used for housing different facilities such as warehouses, shipping centers, retail and service centers along highways. Or it can be used for storage or animal shelters along farmlands.

Figure 20:
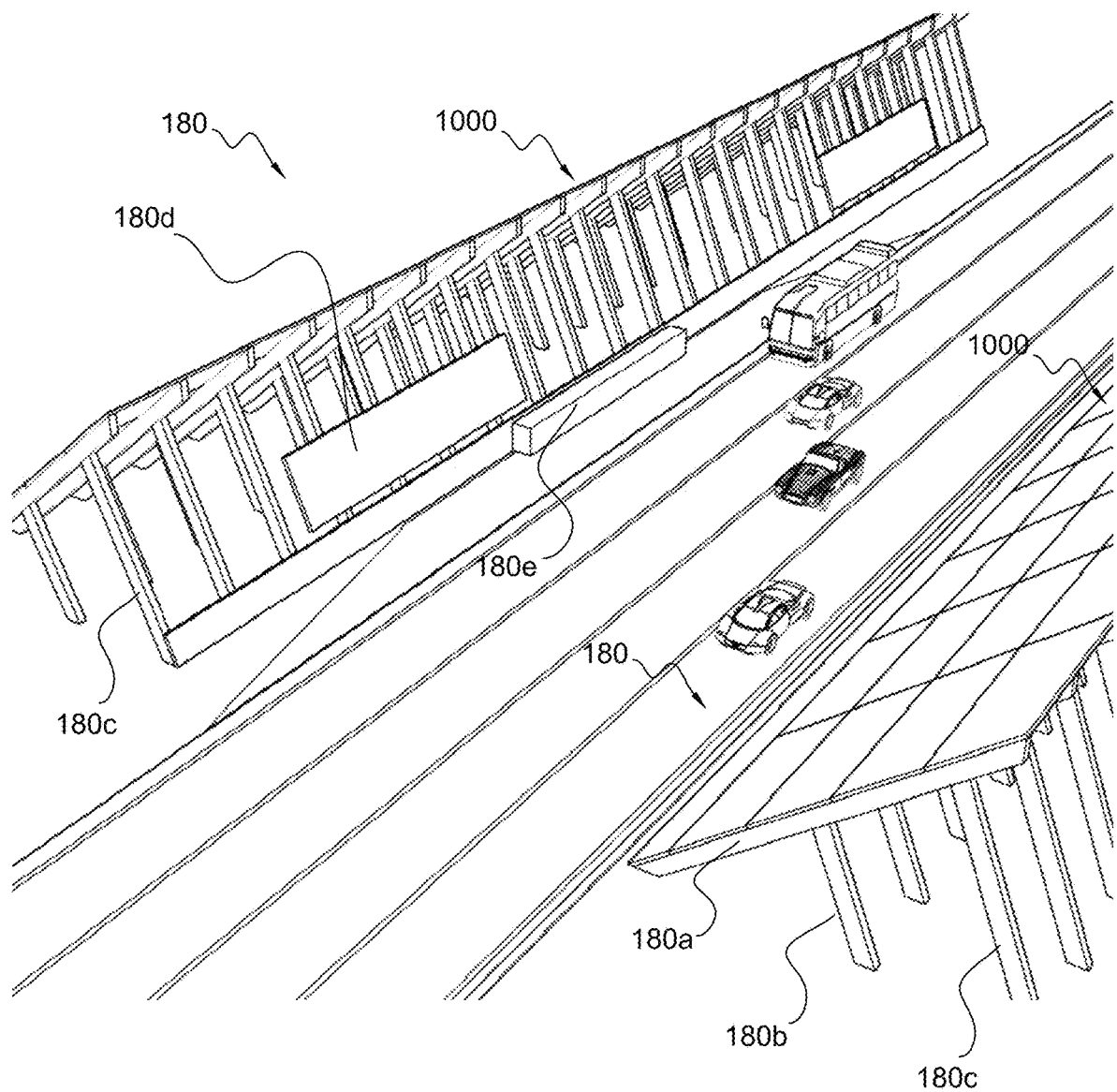
Figure 21:
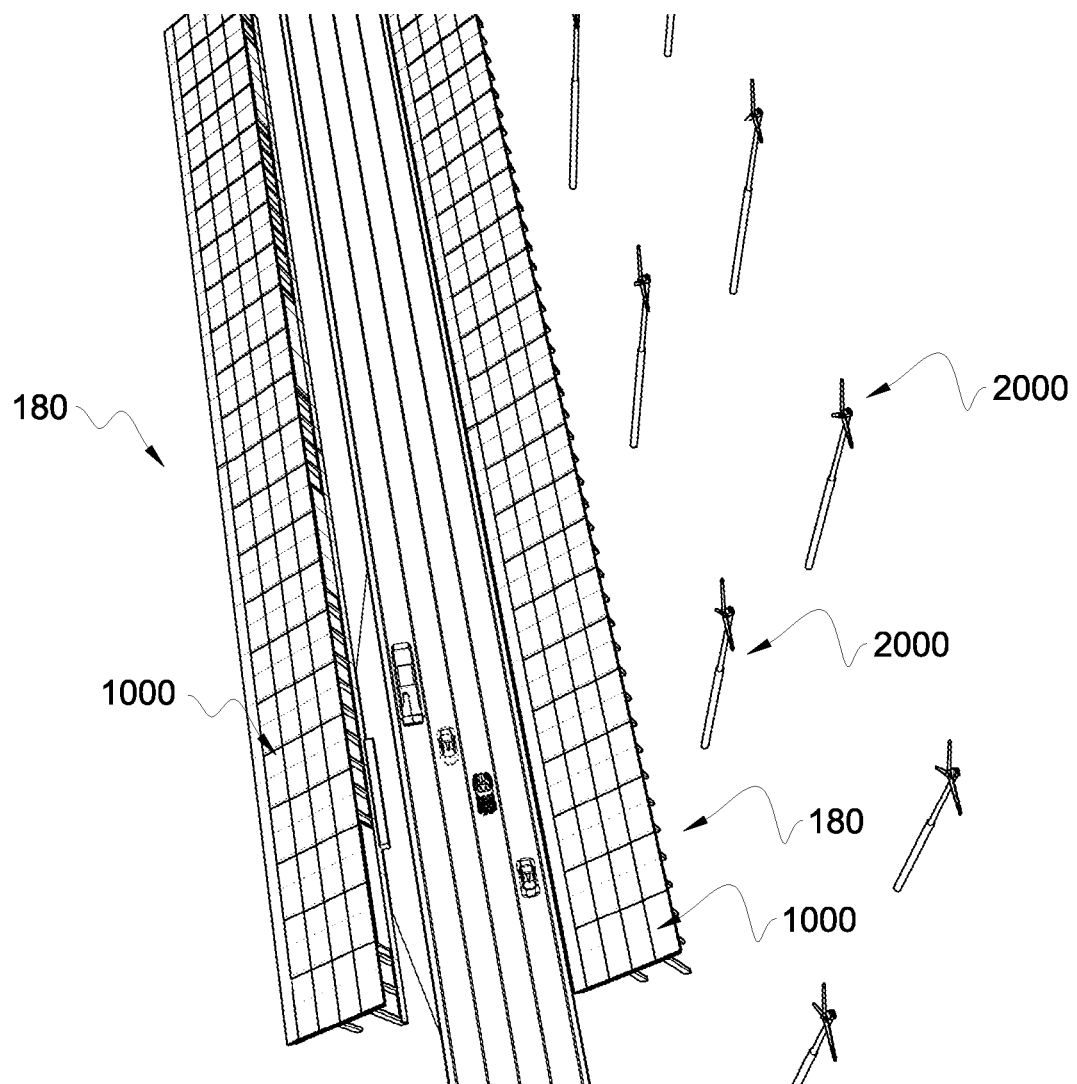
FIG. 21: A 3D view of one embodiment of the invention disclosed in FIG. 20
FIG. 22: Sectional view of one embodiment of the invention
Figure 22:
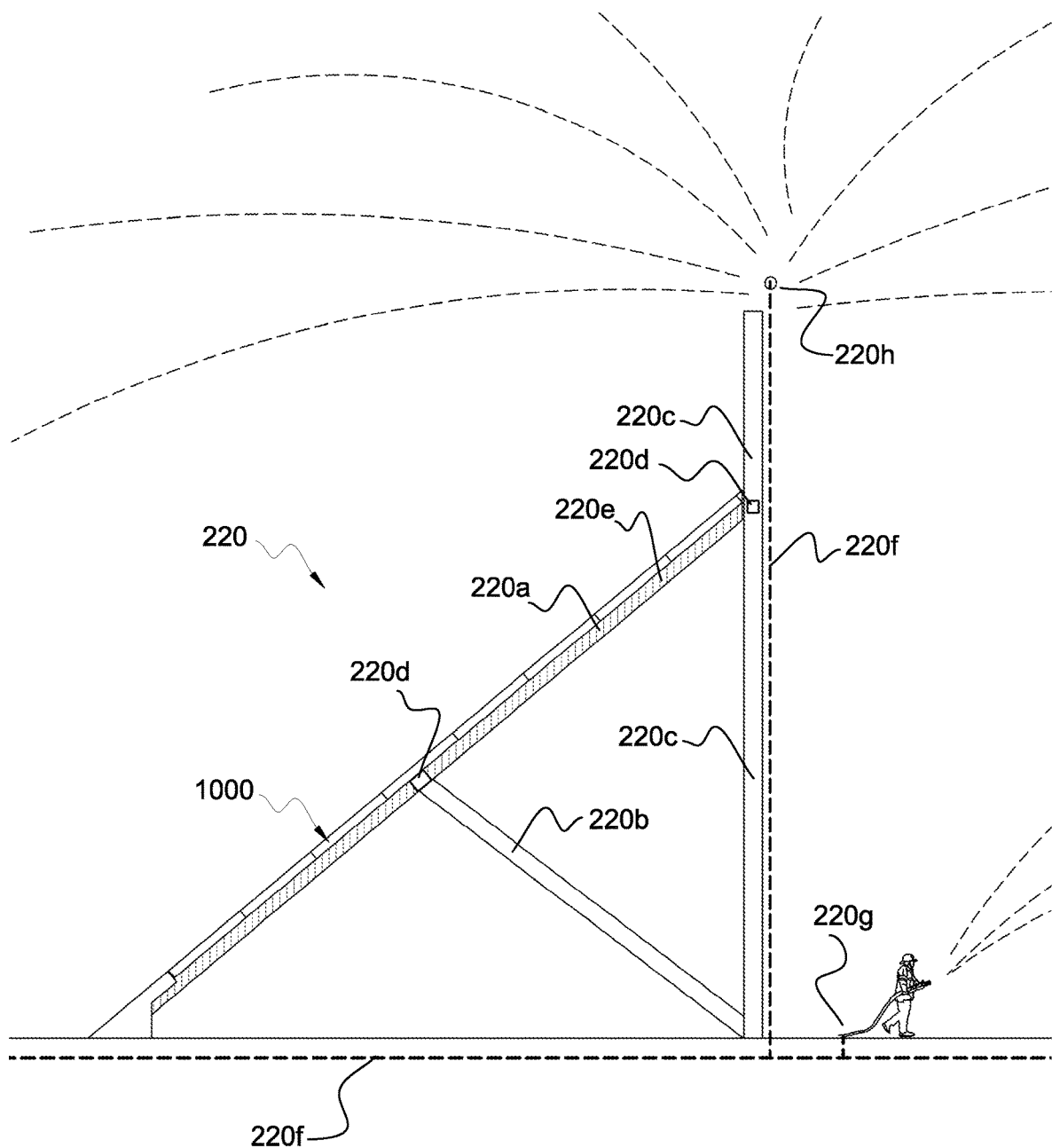

FIGS. 20 and 21 disclose an embodiment of the invention in which barrier wall 180 is fitted with Structural Solar Panels (SSPs) 1000. Structural Solar Panels (SSPs) 1000 are supported by inclined frames 180a. Inclined frames 180a are supported by lateral bracing members 180b and 180c. Advertising panels 180d are fitted on lateral bracing members 180c facing the highway. Electric vehicle charging stations 180e are provided alongside highway that supply electricity produced by Structural Solar Panels (SSPs) 1000. Electric vehicle charging stations 180e can be provided with electricity storage batteries and can also be connected to utility grid. FIG. 21 shows an aerial view of barrier walls 180. This embodiment of the invention that also comprises wind turbines 2000 installed along barrier wall 180. In this exemplary embodiment wind turbines 2000 are installed in two rows staggered with each other to maximize spacing between the turbines for greater wind exposure. The wind turbines can substantially boost the electricity output of solar barrier wall 180 particularly for areas where substantial wind resource is available. Calculations provided earlier in this specification outline return on investment for wind turbines. The orientation of the wind turbines as shown is for reference only; the orientation needs to be predetermined for maximum wind exposure based on the geographic location of an installation. Combining electricity output from wind turbines 2000 with the electricity output from Structural Solar Panels (SSPs) 1000 provides greater benefits because the same transmission lines and equipment is utilized for greater efficiency, and the Return On Investment can be improved.

The electricity produced by Structural Solar Panels (SSPs) 1000 can used to directly power the electric trains. Structural Solar Panels (SSPs) 1000 can be grid-tied to transmit excess electricity to utility grid, and withdraw electricity when needed. The electric supply for the trains can also be backed with electricity storage batteries.

Figure 23:
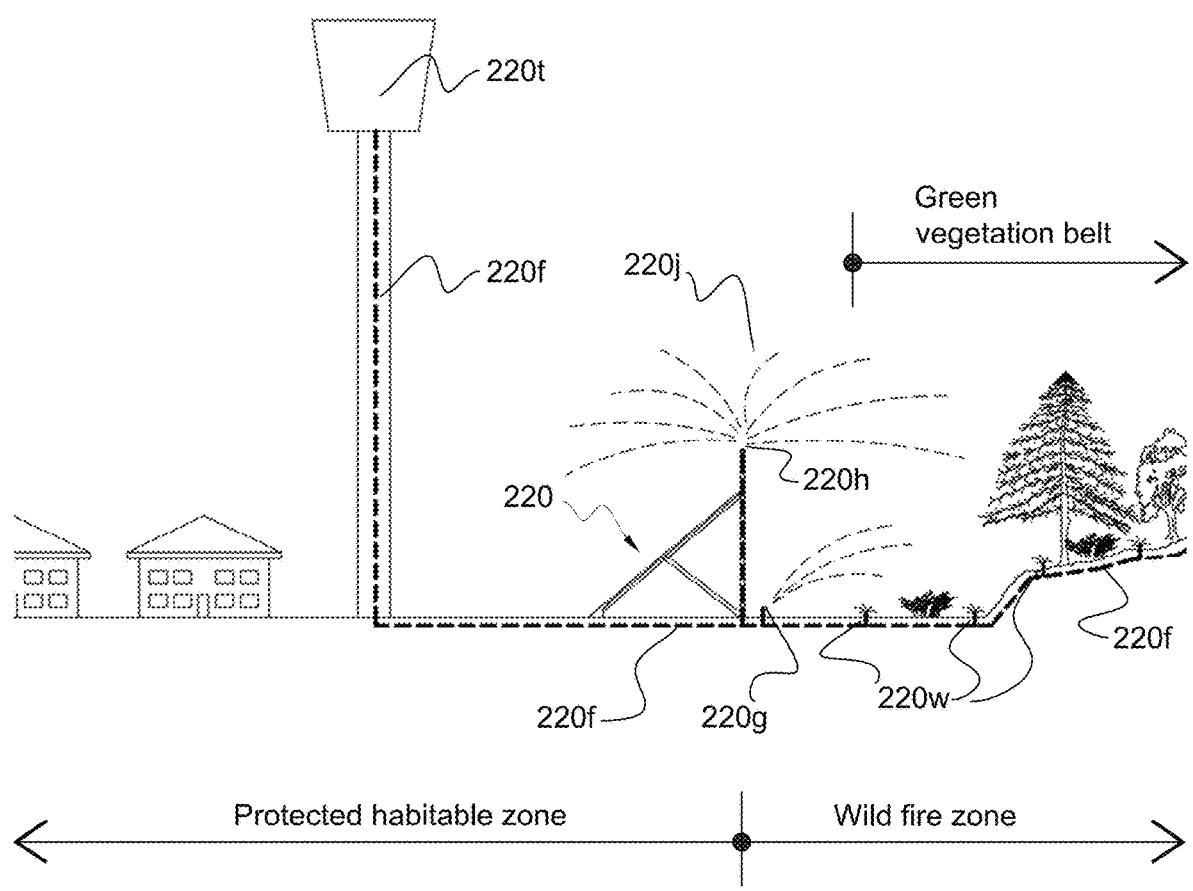
FIG. 23: Sectional view of one embodiment of the invention
Figure 24:
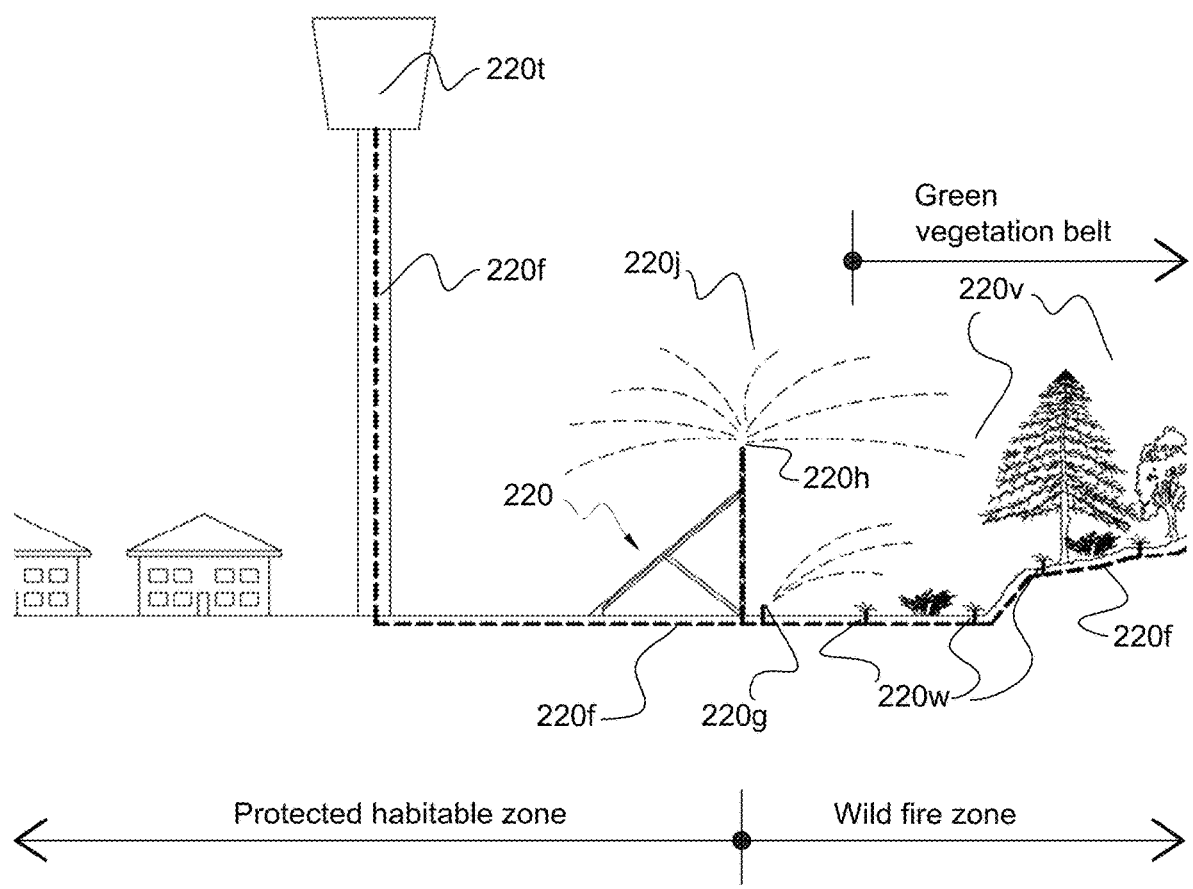
FIG. 24: An overall sectional view of the embodiment disclosed in FIG. 23
FIG. 25: An exemplary site plan showing embodiments disclosed in FIGS. 23 and 24
Figure 25:
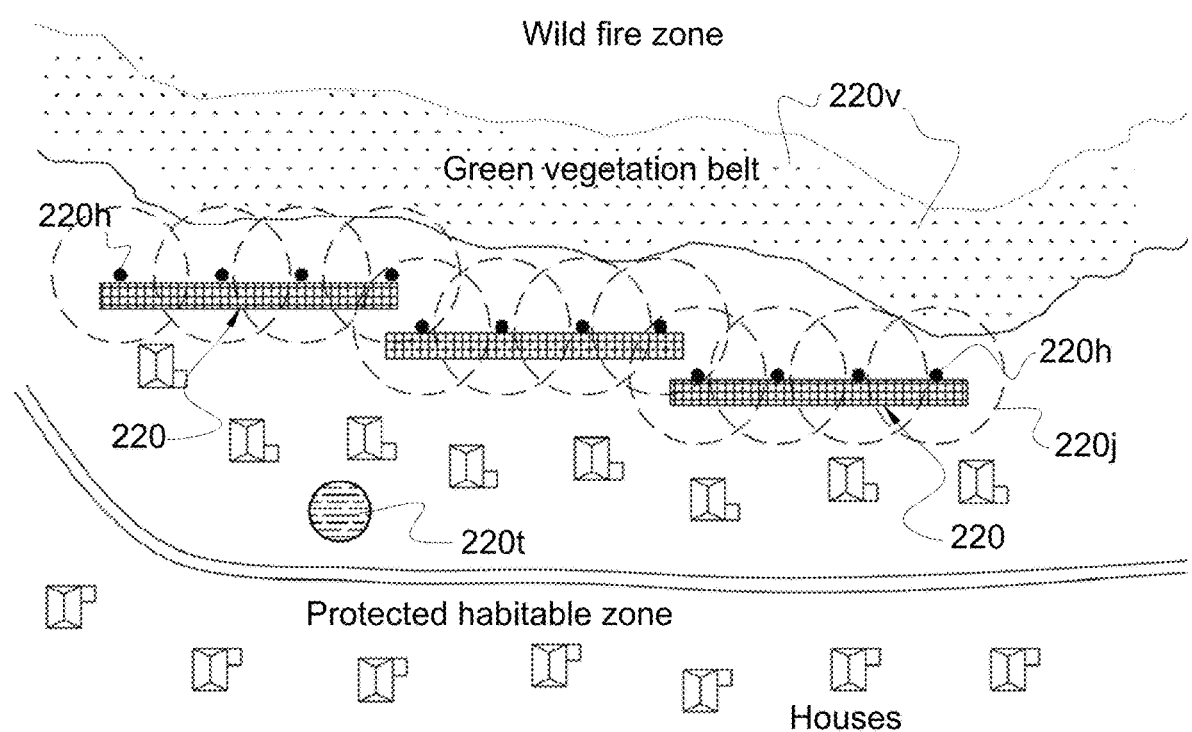

FIGS. 23, 24 and 25 disclose an embodiment of the invention in which inclined barrier wall 220 is used as a fire barrier to protect against wild fires. Barrier wall 220 is located between a fire zone and protected habitable zone to mitigate the risk of fire being spread from a fire prone area to residential, commercial or other habitable area. This embodiment of the invention discloses a novel method of using solar energy as a means to fight fires of any kind. Fire risk from wild fires is well known as observed in California. This embodiment of the invention can greatly mitigate such risks while producing clean electricity from solar energy; and the cost of barrier wall 220 can be greatly subsidized by the financing methods disclosed hereinbefore. The method of using solar energy to fight wild fires comprises the steps of erecting a fire resistant barrier wall 220 with predetermined number of solar panels or Structural Solar Panels (SSPs) that can produce predetermined amount of electricity from solar energy that is sufficient to produce portable water from underground sources; storing that water in overhead water storage tanks 220*t*; equipping barrier wall 220 with high pressure fire hoses 220*h* and connecting fire hoses 220*h* with water lines 220*f* to draw water from storage tanks 220*t* when required; providing plurality of firehose connections 220*g* along barrier wall 220 and connecting them to draw water from storage tanks 220*t* using water lines 220*f*; enabling firefighters to draw water from firehose connections 220*g*; providing plurality of water sprinklers 220*w* along barrier wall 220; connecting sprinklers 220*w* with water lines 220*f* to draw water from storage tanks 220*t* when required; maintaining a green vegetation belt along fire zone using water from sprinklers 220*w* wherein barrier wall 220, fire hoses 220*h*, firehose connections 220*g*, water sprinklers 220*w* and green vegetation belt 220*v* run along a fire zone to substantially separate fire zone from habitable zone.

Barrier wall 220 is comprised of structural inclined frames 220*a*, lateral bracing frames 220*b*, vertical framing members 220*c* and cross bracing members 220*d*. Structural Solar Panels (SSPs) similar to assembly 1000 are supported over inclined frames 220*a*. SSPs 1000 can be provided with fire resistive infill materials or SSPs 1000 can be backed by separate fire resistive panels 220*e*. The electricity from SSPs 1000 can be used to pump underground water which can be stored in overhead water storage tanks 220*t*. Storage tanks 220*t* maintain a water reserve to protect against fire dangers; they can also be used to serve adjacent communities and also be connected to the municipality water supply. Plurality of water lines 220*f* connected from overhead water storage tanks 220*t* are supported by vertical framing members 220*c*. Water lines 220*f* are provided with high pressure water hoses 220*h* proximal to the highest point of vertical framing members 220*c*. 220*j* indicates spread of water from high pressure water hoses 220*h*. Vertical framing members 220*c* are preferably made longer to extend past inclined frames 220*a* vertically. This provides benefits to mount high pressure water hoses 220*h* at a higher level for better water spread to extinguish fires. Water hoses 220*h* can be automated to respond to fires or they can be remotely operated under manual supervision. Plurality of firehose connections 220*g* are also connected to water lines 220*f* which can be used by firefighters to extinguish an approaching fire. Plurality of water sprinklers 220*w* can also be connected to water lines 220*f* for irrigating vegetation to maintain a green belt around a wild fire zone. Sprinklers 220*w* can also be high pressured to dispose a greater water flow during a fire event.

The aforementioned disclosure offers a unique opportunity to harness solar energy to fight wild fires or any other fires such as industrial fires. The aforementioned disclosure offers several layers of protection against wild fires. As a first means of defense, passive fire suppression measures are employed in the form of a green vegetation belt which is maintained by water produced by the electricity from barrier 220. As another passive measure barrier 220 is equipped with fire resistive materials to act as a fire wall. As active fire suppression measures barrier 220 is equipped with high pressure water hoses 220*h* and firehose connections 220*g*. Firehose connections 220*g* enable fighters to quickly deploy around a fire zone without the need for conventional fire trucks. FIG. 25 discloses an exemplary site plan showing how plurality of barrier walls 220 can be used to separate habitable zone from a fire zone and how green vegetation belt 220*v* can be deployed as a passive fire suppression measure. It is the intent of the applicant to pursue an independent claim or a continuation or divisional application for the aforementioned solar powered fire extinguishing systems and methods.

Conventional solar panels or Structural Solar Panels (SSPs) as shown in all embodiments of the present invention form an active part of the installation to produce electricity from solar energy. The electricity can be distributed by using an off-grid or a grid-tied electrical system by using necessary devices such as inverters, controllers, transformers, electrical feeders and transmission lines (not shown).

The embodiments of the present invention as described herein are for examples only; they should not be used in a limiting sense to interpret the scope of the present invention. Other configurations of solar panels equipped structures (inclined photovoltaic barrier, inclined photovoltaic structure(s), photovoltaic canopies), and supporting barrier wall, and canopy structures are within the scope of the present invention. For example the present invention can be exercised in a number of other configurations such as attaching solar panels to concrete walls, fences made of closely spaced bollards, Normandy or Anti-Ram fencing. Other modifications that can be made to these exemplary embodiments are within the scope of the present invention.

The invention claimed is:

1. A barrier wall comprising:
    a plurality of inclined structural framing members;
    a plurality of lateral bracing members that support an upper portion of the inclined structural framing members and are inclined in an opposite direction of the inclined structural framing members;
    wherein a portion of at least one of the plurality of inclined structural framing members extends over a top edge of at least one of the plurality of lateral bracing members;
    a plurality of cross bracing members arranged orthogonal and between the plurality of inclined structural framing members;
    a plurality of structural wedges arranged on top of the plurality of inclined structural framing members forming rows of steps along a surface of the plurality of inclined structural framing members;
    a plurality of rigid panels arranged on top of the plurality of structural wedges;
    a plurality of solar panels arranged on top of the plurality of rigid panels to form rows of solar panels facing a sunward direction to produce electricity; and
    wherein the plurality of inclined structural framing members, the plurality of lateral bracing members, the plurality of cross bracing members, and the plurality of rigid panels are made of precast concrete.

2. The barrier wall of claim 1, further comprising at least one wind turbine disposed adjacent to at least one of the plurality of inclined structural framing members.

3. The barrier wall of claim 1, further comprising at least one water sprinkler.

4. The barrier wall of claim 1, further comprising at least one water hose.

5. The barrier wall of claim 1, further comprising at least one sheet pile configured to support the plurality of inclined structural framing members.

6. A border wall comprising a plurality of barrier walls of claim 1.

* * * * *